(12) United States Patent
Tuominen

(10) Patent No.: US 7,669,014 B2
(45) Date of Patent: Feb. 23, 2010

(54) TRANSPOSE MEMORY AND METHOD THEREOF

(75) Inventor: Jarno Mikael Tuominen, Turku (FI)

(73) Assignee: Nokia Corporation (FI)

( * ) Notice: Subject to any disclaimer, the term of this patent is extended or adjusted under 35 U.S.C. 154(b) by 260 days.

(21) Appl. No.: 11/781,617

(22) Filed: Jul. 23, 2007

(65) Prior Publication Data

US 2009/0031089 A1 Jan. 29, 2009

(51) Int. Cl.
*G06F 13/00* (2006.01)
(52) U.S. Cl. .................. 711/149; 711/157; 711/168
(58) Field of Classification Search .......... 711/149, 711/157, 168
See application file for complete search history.

(56) References Cited

U.S. PATENT DOCUMENTS 5,481,487 A * 1/1996 Jang et al. ............ 708/401

* cited by examiner

Primary Examiner—Reba I Elmore
(74) Attorney, Agent, or Firm—Alston & Bird LLP

(57) ABSTRACT

A transpose memory circuit is provided which comprises a number of dual port memory blocks each having a plurality of storage cells each configured for storing one or more data word. The dual port memory blocks form a storage array for storing at least one input matrix and outputting the at least one input matrix in transposed form. A data input is provided to receive a plurality data words on each cycle and a data output is provided to output a plurality of data words on each cycle. A read address logic is provided to generate read addresses such that one cell of each dual port memory block can be read out on each cycle. A write address logic is provided to generate write addresses such that one cell k of each dual port memory block can be written on each cycle. In each cycle, one storage cell of each dual port memory block is addressed by the read address logic. The data words stored in the addressed storage cells are read out from one dual port memory block and outputted through the data output. In each cycle, one storage cell of each dual port memory block is addressed by the write address logic, where the addressed storage cells have been read out in a preceding cycle and into which storage cells data words received through the data input are written. The transpose memory circuit is provided to receive an input matrix in cycles and to output the transposed input matrix in next cycles without any dead cycles interposed between them.

25 Claims, 31 Drawing Sheets

|          | Blk h=0 | Blk h=1 | Blk h=2 | Blk h=3 | Blk h=4 | Blk h=5 | Blk h=6 | Blk h=7 |
|---|---|---|---|---|---|---|---|---|
| Cell k=0 | 0-0 | 0-1 | 0-2 | 0-3 | 0-4 | 0-5 | 0-6 | 0-7 |
| Cell k=1 | 1-0 | 1-1 | 1-2 | 1-3 | 1-4 | 1-5 | 1-6 | 1-7 |
| Cell k=2 | 2-0 | 2-1 | 2-2 | 2-3 | 2-4 | 2-5 | 2-6 | 2-7 |
| Cell k=3 | 3-0 | 3-1 | 3-2 | 3-3 | 3-4 | 3-5 | 3-6 | 3-7 |
| Cell k=4 | 4-0 | 4-1 | 4-2 | 4-3 | 4-4 | 4-5 | 4-6 | 4-7 |
| Cell k=5 | 5-0 | 5-1 | 5-2 | 5-3 | 5-4 | 5-5 | 5-6 | 5-7 |
| Cell k=6 | 6-0 | 6-1 | 6-2 | 6-3 | 6-4 | 6-5 | 6-6 | 6-7 |
| Cell k=7 | 7-0 | 7-1 | 7-2 | 7-3 | 7-4 | 7-5 | 7-6 | 7-7 |

Fig. 2

|  | Blk h=0 | Blk h=1 | Blk h=2 | Blk h=3 | Blk h=4 | Blk h=5 | Blk h=6 | Blk h=7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 | 1-1 | 1-2 | 1-3 | 1-4 | 1-5 | 1-6 | 1-7 |
| Cell k=2 | 2-0 | 2-1 | 2-2 | 2-3 | 2-4 | 2-5 | 2-6 | 2-7 |
| Cell k=3 | 3-0 | 3-1 | 3-2 | 3-3 | 3-4 | 3-5 | 3-6 | 3-7 |
| Cell k=4 | 4-0 | 4-1 | 4-2 | 4-3 | 4-4 | 4-5 | 4-6 | 4-7 |
| Cell k=5 | 5-0 | 5-1 | 5-2 | 5-3 | 5-4 | 5-5 | 5-6 | 5-7 |
| Cell k=6 | 6-0 | 6-1 | 6-2 | 6-3 | 6-4 | 6-5 | 6-6 | 6-7 |
| Cell k=7 | 7-0 | 7-1 | 7-2 | 7-3 | 7-4 | 7-5 | 7-6 | 7-7 |

Even Matrix Write Counter Value $q = 0 \triangleq$ Write Address

| | | | | | | | | | |
|---|---|---|---|---|---|---|---|---|---|
| Block ID | 0 | 1 | 2 | 3 | 4 | 5 | 6 | 7 | → h |
| Write Address | 0 | 0 | 0 | 0 | 0 | 0 | 0 | 0 | → k |
| Word Select Offset | 0 | 1 | 2 | 3 | 4 | 5 | 6 | 7 | |

Fig. 5a

|  | Blk h=0 | Blk h=1 | Blk h=2 | Blk h=3 | Blk h=4 | Blk h=5 | Blk h=6 | Blk h=7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 | 2-1 | 2-2 | 2-3 | 2-4 | 2-5 | 2-6 | 2-7 |
| Cell k=3 | 3-0 | 3-1 | 3-2 | 3-3 | 3-4 | 3-5 | 3-6 | 3-7 |
| Cell k=4 | 4-0 | 4-1 | 4-2 | 4-3 | 4-4 | 4-5 | 4-6 | 4-7 |
| Cell k=5 | 5-0 | 5-1 | 5-2 | 5-3 | 5-4 | 5-5 | 5-6 | 5-7 |
| Cell k=6 | 6-0 | 6-1 | 6-2 | 6-3 | 6-4 | 6-5 | 6-6 | 6-7 |
| Cell k=7 | 7-0 | 7-1 | 7-2 | 7-3 | 7-4 | 7-5 | 7-6 | 7-7 |

Even Matrix Write Counter Value $q = 1 \stackrel{\wedge}{=}$ Write Address

| Block ID | 0 | 1 | 2 | 3 | 4 | 5 | 6 | 7 | → | h |
|---|---|---|---|---|---|---|---|---|---|---|
| Write Address | 1 | 1 | 1 | 1 | 1 | 1 | 1 | 1 | → | k |
| Word Select Offset | 7 | 0 | 1 | 2 | 3 | 4 | 5 | 6 | | |

Fig. 5b

|  | Blk h=0 | Blk h=1 | Blk h=2 | Blk h=3 | Blk h=4 | Blk h=5 | Blk h=6 | Blk h=7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell k=3 | 3-0 | 3-1 | 3-2 | 3-3 | 3-4 | 3-5 | 3-6 | 3-7 |
| Cell k=4 | 4-0 | 4-1 | 4-2 | 4-3 | 4-4 | 4-5 | 4-6 | 4-7 |
| Cell k=5 | 5-0 | 5-1 | 5-2 | 5-3 | 5-4 | 5-5 | 5-6 | 5-7 |
| Cell k=6 | 6-0 | 6-1 | 6-2 | 6-3 | 6-4 | 6-5 | 6-6 | 6-7 |
| Cell k=7 | 7-0 | 7-1 | 7-2 | 7-3 | 7-4 | 7-5 | 7-6 | 7-7 |

Even Matrix Write Counter Value q = 2 $\triangleq$ Write Address

| Block ID | 0 | 1 | 2 | 3 | 4 | 5 | 6 | 7 | → | h |
|---|---|---|---|---|---|---|---|---|---|---|
| Write Address | 2 | 2 | 2 | 2 | 2 | 2 | 2 | 2 | → | k |
| Word Select Offset | 6 | 7 | 0 | 1 | 2 | 3 | 4 | 5 | | |

Fig. 5c

| | Blk h=0 | Blk h=1 | Blk h=2 | Blk h=3 | Blk h=4 | Blk h=5 | Blk h=6 | Blk h=7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 $y^e_{30}$ | 3-4 $y^e_{31}$ | 3-5 $y^e_{32}$ | 3-6 $y^e_{33}$ | 3-7 $y^e_{34}$ |
| Cell k=4 | 4-0 | 4-1 | 4-2 | 4-3 | 4-4 | 4-5 | 4-6 | 4-7 |
| Cell k=5 | 5-0 | 5-1 | 5-2 | 5-3 | 5-4 | 5-5 | 5-6 | 5-7 |
| Cell k=6 | 6-0 | 6-1 | 6-2 | 6-3 | 6-4 | 6-5 | 6-6 | 6-7 |
| Cell k=7 | 7-0 | 7-1 | 7-2 | 7-3 | 7-4 | 7-5 | 7-6 | 7-7 |

Even Matrix Write Counter Value $q = 3 \triangleq$ Write Address

| | | | | | | | | | |
|---|---|---|---|---|---|---|---|---|---|
| Block ID | 0 | 1 | 2 | 3 | 4 | 5 | 6 | 7 | → h |
| Write Address | 3 | 3 | 3 | 3 | 3 | 3 | 3 | 3 | → k |
| Word Select Offset | 5 | 6 | 7 | 0 | 1 | 2 | 3 | 4 | |

Fig. 5d

|  | Blk h=0 | Blk h=1 | Blk h=2 | Blk h=3 | Blk h=4 | Blk h=5 | Blk h=6 | Blk h=7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 $y^e_{30}$ | 3-4 $y^e_{31}$ | 3-5 $y^e_{32}$ | 3-6 $y^e_{33}$ | 3-7 $y^e_{34}$ |
| Cell k=4 | 4-0 $y^e_{44}$ | 4-1 $y^e_{45}$ | 4-2 $y^e_{46}$ | 4-3 $y^e_{47}$ | 4-4 $y^e_{40}$ | 4-5 $y^e_{41}$ | 4-6 $y^e_{42}$ | 4-7 $y^e_{43}$ |
| Cell k=5 | 5-0 $y^e_{53}$ | 5-1 $y^e_{54}$ | 5-2 $y^e_{55}$ | 5-3 $y^e_{56}$ | 5-4 $y^e_{57}$ | 5-5 $y^e_{50}$ | 5-6 $y^e_{51}$ | 5-7 $y^e_{52}$ |
| Cell k=6 | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^e_{60}$ | 6-7 $y^e_{61}$ |
| Cell k=7 | 7-0 $y^e_{71}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^e_{70}$ |

Even Matrix Write Counter Value $q = 7 \triangleq$ Write Address

| Block ID | 0 | 1 | 2 | 3 | 4 | 5 | 6 | 7 | → h |
| Write Address | 7 | 7 | 7 | 7 | 7 | 7 | 7 | 7 | → k |
| Word Select Offset | 1 | 2 | 3 | 4 | 5 | 6 | 7 | 0 | |

Fig. 5e

Even Matrices

| Write Counter Value q | Write Address | | | | | | | | Word Select Offset | | | | | | | | Block h |
|---|---|---|---|---|---|---|---|---|---|---|---|---|---|---|---|---|---|
| | 0 | 1 | 2 | 3 | 4 | 5 | 6 | 7 | 0 | 1 | 2 | 3 | 4 | 5 | 6 | 7 | |
| 0 | 0 | 0 | 0 | 0 | 0 | 0 | 0 | 0 | 0 | 1 | 2 | 3 | 4 | 5 | 6 | 7 | sel$_h$(0) |
| 1 | 1 | 1 | 1 | 1 | 1 | 1 | 1 | 1 | 7 | 0 | 1 | 2 | 3 | 4 | 5 | 6 | sel$_h$(1) |
| 2 | 2 | 2 | 2 | 2 | 2 | 2 | 2 | 2 | 6 | 7 | 0 | 1 | 2 | 3 | 4 | 5 | sel$_h$(2) |
| 3 | 3 | 3 | 3 | 3 | 3 | 3 | 3 | 3 | 5 | 6 | 7 | 0 | 1 | 2 | 3 | 4 | sel$_h$(3) |
| 4 | 4 | 4 | 4 | 4 | 4 | 4 | 4 | 4 | 4 | 5 | 6 | 7 | 0 | 1 | 2 | 3 | sel$_h$(4) |
| 5 | 5 | 5 | 5 | 5 | 5 | 5 | 5 | 5 | 3 | 4 | 5 | 6 | 7 | 0 | 1 | 2 | sel$_h$(5) |
| 6 | 6 | 6 | 6 | 6 | 6 | 6 | 6 | 6 | 2 | 3 | 4 | 5 | 6 | 7 | 0 | 1 | sel$_h$(6) |
| 7 | 7 | 7 | 7 | 7 | 7 | 7 | 7 | 7 | 1 | 2 | 3 | 4 | 5 | 6 | 7 | 0 | sel$_h$(7) |

= k  Sequence sel$_h$(q)

Fig. 6

|  | Blk 0 | Blk 1 | Blk 2 | Blk 3 | Blk 4 | Blk 5 | Blk 6 | Blk 7 |
|---|---|---|---|---|---|---|---|---|
| Cell $k=0$ | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell $k=1$ | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell $k=2$ | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell $k=3$ | 3-0 $y^e_{35}$ | 3-1 $y^e_{36}$ | 3-2 $y^e_{37}$ | 3-3 $y^e_{30}$ | 3-4 $y^e_{31}$ | 3-5 $y^e_{32}$ | 3-6 $y^e_{33}$ | 3-7 $y^e_{34}$ |
| Cell $k=4$ | 4-0 $y^e_{44}$ | 4-1 $y^e_{45}$ | 4-2 $y^e_{46}$ | 4-3 $y^e_{47}$ | 4-4 $y^e_{40}$ | 4-5 $y^e_{41}$ | 4-6 $y^e_{42}$ | 4-7 $y^e_{43}$ |
| Cell $k=5$ | 5-0 $y^e_{53}$ | 5-1 $y^e_{54}$ | 5-2 $y^e_{55}$ | 5-3 $y^e_{56}$ | 5-4 $y^e_{57}$ | 5-5 $y^e_{50}$ | 5-6 $y^e_{51}$ | 5-7 $y^e_{52}$ |
| Cell $k=6$ | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^e_{60}$ | 6-7 $y^e_{61}$ |
| Cell $k=7$ | 7-0 $y^e_{71}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^e_{70}$ |

Even Matrix Read Counter Value $q' = 0$
Block ID      0  1  2  3  4  5  6  7  → h
Read Address  0  1  2  3  4  5  6  7  → k

Fig. 7a

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 $y^e_{30}$ | 3-4 $y^e_{31}$ | 3-5 $y^e_{32}$ | 3-6 $y^e_{33}$ | 3-7 $y^e_{34}$ |
| Cell k=4 | 4-0 $y^e_{44}$ | 4-1 $y^e_{45}$ | 4-2 $y^e_{46}$ | 4-3 $y^e_{47}$ | 4-4 $y^e_{40}$ | 4-5 $y^e_{41}$ | 4-6 $y^e_{42}$ | 4-7 $y^e_{43}$ |
| Cell k=5 | 5-0 $y^e_{53}$ | 5-1 $y^e_{54}$ | 5-2 $y^e_{55}$ | 5-3 $y^e_{56}$ | 5-4 $y^e_{57}$ | 5-5 $y^e_{50}$ | 5-6 $y^e_{51}$ | 5-7 $y^e_{52}$ |
| Cell k=6 | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^e_{60}$ | 6-7 $y^e_{61}$ |
| Cell k=7 | 7-0 $y^e_{71}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^e_{70}$ |

Even Matrix Read Counter Value $q' = 1$

| Block ID | 0 | 1 | 2 | 3 | 4 | 5 | 6 | 7 | → | h |
|---|---|---|---|---|---|---|---|---|---|---|
| Read Address | 7 | 0 | 1 | 2 | 3 | 4 | 5 | 6 | → | k |

Fig. 7b

|  | Blk 0 | Blk 1 | Blk 2 | Blk 3 | Blk 4 | Blk 5 | Blk 6 | Blk 7 |
|---|---|---|---|---|---|---|---|---|
| Cell $k=0$ | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell $k=1$ | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell $k=2$ | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell $k=3$ | 3-0 $y^e_{35}$ | 3-1 $y^e_{36}$ | 3-2 $y^e_{37}$ | 3-3 $y^e_{30}$ | 3-4 $y^e_{31}$ | 3-5 $y^e_{32}$ | 3-6 $y^e_{33}$ | 3-7 $y^e_{34}$ |
| Cell $k=4$ | 4-0 $y^e_{44}$ | 4-1 $y^e_{45}$ | 4-2 $y^e_{46}$ | 4-3 $y^e_{47}$ | 4-4 $y^e_{40}$ | 4-5 $y^e_{41}$ | 4-6 $y^e_{42}$ | 4-7 $y^e_{43}$ |
| Cell $k=5$ | 5-0 $y^e_{53}$ | 5-1 $y^e_{54}$ | 5-2 $y^e_{55}$ | 5-3 $y^e_{56}$ | 5-4 $y^e_{57}$ | 5-5 $y^e_{50}$ | 5-6 $y^e_{51}$ | 5-7 $y^e_{52}$ |
| Cell $k=6$ | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^e_{60}$ | 6-7 $y^e_{61}$ |
| Cell $k=7$ | 7-0 $y^e_{71}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^e_{70}$ |

Even Matrix Read Counter Value q' = 2
Block ID        0  1  2  3  4  5  6  7  → h
Read Address  6  7  0  1  2  3  4  5  → k

Fig. 7c

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 $y^e_{30}$ | 3-4 $y^e_{31}$ | 3-5 $y^e_{32}$ | 3-6 $y^e_{33}$ | 3-7 $y^e_{34}$ |
| Cell k=4 | 4-0 $y^e_{44}$ | 4-1 $y^e_{45}$ | 4-2 $y^e_{46}$ | 4-3 $y^e_{47}$ | 4-4 $y^e_{40}$ | 4-5 $y^e_{41}$ | 4-6 $y^e_{42}$ | 4-7 $y^e_{43}$ |
| Cell k=5 | 5-0 $y^e_{53}$ | 5-1 $y^e_{54}$ | 5-2 $y^e_{55}$ | 5-3 $y^e_{56}$ | 5-4 $y^e_{57}$ | 5-5 $y^e_{50}$ | 5-6 $y^e_{51}$ | 5-7 $y^e_{52}$ |
| Cell k=6 | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^e_{60}$ | 6-7 $y^e_{61}$ |
| Cell k=7 | 7-0 $y^e_{71}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^e_{70}$ |

Even Matrix Read Counter Value q' = 3
Block ID        0  1  2  3  4  5  6  7  → h
Read Address    5  6  7  0  1  2  3  4  → k

Fig. 7d

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^e_{10}$ | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^e_{20}$ | 2-3 $y^e_{21}$ | 2-4 $y^e_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 $y^e_{30}$ | 3-4 $y^e_{31}$ | 3-5 $y^e_{32}$ | 3-6 $y^e_{33}$ | 3-7 $y^e_{34}$ |
| Cell k=4 | 4-0 $y^e_{44}$ | 4-1 $y^e_{45}$ | 4-2 $y^e_{46}$ | 4-3 $y^e_{47}$ | 4-4 $y^e_{40}$ | 4-5 $y^e_{41}$ | 4-6 $y^e_{42}$ | 4-7 $y^e_{43}$ |
| Cell k=5 | 5-0 $y^e_{53}$ | 5-1 $y^e_{54}$ | 5-2 $y^e_{55}$ | 5-3 $y^e_{56}$ | 5-4 $y^e_{57}$ | 5-5 $y^e_{50}$ | 5-6 $y^e_{51}$ | 5-7 $y^e_{52}$ |
| Cell k=6 | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^e_{60}$ | 6-7 $y^e_{61}$ |
| Cell k=7 | 7-0 $y^e_{71}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^e_{70}$ |

Even Matrix Read Counter Value q' = 7
Block ID           0   1   2   3   4   5   6   7   → h
Read Address    1   2   3   4   5   6   7   0   → k

Fig. 7e

Even Matrices

| Read Counter Value q' | Read Address | | | | | | | | Block h |
|---|---|---|---|---|---|---|---|---|---|
| | 0 | 1 | 2 | 3 | 4 | 5 | 6 | 7 | |
| 0 | 0 | 1 | 2 | 3 | 4 | 5 | 6 | 7 | $rd_h(0)$ |
| 1 | 7 | 0 | 1 | 2 | 3 | 4 | 5 | 6 | $rd_h(1)$ |
| 2 | 6 | 7 | 0 | 1 | 2 | 3 | 4 | 5 | $rd_h(2)$ |
| 3 | 5 | 6 | 7 | 0 | 1 | 2 | 3 | 4 | $rd_h(3)$ |
| 4 | 4 | 5 | 6 | 7 | 0 | 1 | 2 | 3 | $rd_h(4)$ |
| 5 | 3 | 4 | 5 | 6 | 7 | 0 | 1 | 2 | $rd_h(5)$ |
| 6 | 2 | 3 | 4 | 5 | 6 | 7 | 0 | 1 | $rd_h(6)$ |
| 7 | 1 | 2 | 3 | 4 | 5 | 6 | 7 | 0 | $rd_h(7)$ |

Word Reorderer:
Vector Element Reorder Scheme

| Read Counter Type q' \ Input Vector Elements i | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 1 | 2 | 3 | 4 | 5 | 6 | 7 | 0 |
| 2 | 2 | 3 | 4 | 5 | 6 | 7 | 0 | 1 |
| 3 | 3 | 4 | 5 | 6 | 7 | 0 | 1 | 2 |
| 4 | 4 | 5 | 6 | 7 | 0 | 1 | 2 | 3 |
| 5 | 5 | 6 | 7 | 0 | 1 | 2 | 3 | 4 |
| 6 | 6 | 7 | 0 | 1 | 2 | 3 | 4 | 5 |
| 7 | 7 | 0 | 1 | 2 | 3 | 4 | 5 | 6 |

Output vector Elements j: 0, 1, 2, 3, 4, 5, 6, 7

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 free | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 free | 1-2 $y^e_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 free | 2-3 $y^e_{21}$ | 2-4 $y^e_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 free | 3-4 $y^e_{31}$ | 3-5 $y^e_{32}$ | 3-6 $y^e_{33}$ | 3-7 $y^e_{34}$ |
| Cell k=4 | 4-0 $y^e_{44}$ | 4-1 $y^e_{45}$ | 4-2 $y^e_{46}$ | 4-3 $y^e_{47}$ | 4-4 free | 4-5 $y^e_{41}$ | 4-6 $y^e_{42}$ | 4-7 $y^e_{43}$ |
| Cell k=5 | 5-0 $y^e_{53}$ | 5-1 $y^e_{54}$ | 5-2 $y^e_{55}$ | 5-3 $y^e_{56}$ | 5-4 $y^e_{57}$ | 5-5 free | 5-6 $y^e_{51}$ | 5-7 $y^e_{52}$ |
| Cell k=6 | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 free | 6-7 $y^e_{61}$ |
| Cell k=7 | 7-0 $y^e_{71}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 free |

Even Matrix Read Counter Value q' = 1
Block ID (h)        0  1  2  3  4  5  6  7
Read Address (k)   7  0  1  2  3  4  5  6

Fig. 10a

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y_{00}^o$ | 0-1 $y_{01}^e$ | 0-2 $y_{02}^e$ | 0-3 $y_{03}^e$ | 0-4 $y_{04}^e$ | 0-5 $y_{05}^e$ | 0-6 $y_{06}^e$ | 0-7 $y_{07}^e$ |
| Cell k=1 | 1-0 $y_{17}^e$ | 1-1 $y_{01}^o$ | 1-2 $y_{11}^e$ | 1-3 $y_{12}^e$ | 1-4 $y_{13}^e$ | 1-5 $y_{14}^e$ | 1-6 $y_{15}^e$ | 1-7 $y_{16}^e$ |
| Cell k=2 | 2-0 $y_{26}^e$ | 2-1 $y_{27}^e$ | 2-2 $y_{02}^o$ | 2-3 $y_{21}^e$ | 2-4 $y_{22}^e$ | 2-5 $y_{23}^e$ | 2-6 $y_{24}^e$ | 2-7 $y_{25}^e$ |
| Cell k=3 | 3-0 $y_{35}^e$ | 3-1 $y_{36}^e$ | 3-2 $y_{37}^e$ | 3-3 $y_{03}^o$ | 3-4 $y_{31}^e$ | 3-5 $y_{32}^e$ | 3-6 $y_{33}^e$ | 3-7 $y_{34}^e$ |
| Cell k=4 | 4-0 $y_{44}^e$ | 4-1 $y_{45}^e$ | 4-2 $y_{46}^e$ | 4-3 $y_{47}^e$ | 4-4 $y_{04}^o$ | 4-5 $y_{41}^e$ | 4-6 $y_{42}^e$ | 4-7 $y_{43}^e$ |
| Cell k=5 | 5-0 $y_{53}^e$ | 5-1 $y_{54}^e$ | 5-2 $y_{55}^e$ | 5-3 $y_{56}^e$ | 5-4 $y_{57}^e$ | 5-5 $y_{05}^o$ | 5-6 $y_{51}^e$ | 5-7 $y_{52}^e$ |
| Cell k=6 | 6-0 $y_{62}^e$ | 6-1 $y_{63}^e$ | 6-2 $y_{64}^e$ | 6-3 $y_{65}^e$ | 6-4 $y_{66}^e$ | 6-5 $y_{67}^e$ | 6-6 $y_{06}^o$ | 6-7 $y_{61}^e$ |
| Cell k=7 | 7-0 $y_{71}^e$ | 7-1 $y_{72}^e$ | 7-2 $y_{73}^e$ | 7-3 $y_{74}^e$ | 7-4 $y_{75}^e$ | 7-5 $y_{76}^e$ | 7-6 $y_{77}^e$ | 7-7 $y_{07}^o$ |

Even Matrix Read Counter Value q' = 1
Block ID (h)        0  1  2  3  4  5  6  7
Read Address (k)    7  0  1  2  3  4  5  6

Odd Matrix Write Counter Value q = 0
Block ID (h)        0  1  2  3  4  5  6  7
Word Select Offset  0  1  2  3  4  5  6  7
Write Address (k)   0  1  2  3  4  5  6  7

Fig. 10b

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y^o_{00}$ | 0-1 $y^o_{10}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^o_{01}$ | 1-2 $y^o_{11}$ | 1-3 $y^e_{12}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^o_{02}$ | 2-3 $y^o_{12}$ | 2-4 $y^e_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 $y^o_{03}$ | 3-4 $y^o_{13}$ | 3-5 $y^e_{32}$ | 3-6 $y^e_{33}$ | 3-7 $y^e_{34}$ |
| Cell k=4 | 4-0 $y^e_{44}$ | 4-1 $y^e_{45}$ | 4-2 $y^e_{46}$ | 4-3 $y^e_{47}$ | 4-4 $y^o_{04}$ | 4-5 $y^o_{14}$ | 4-6 $y^e_{42}$ | 4-7 $y^e_{43}$ |
| Cell k=5 | 5-0 $y^e_{53}$ | 5-1 $y^e_{54}$ | 5-2 $y^e_{55}$ | 5-3 $y^e_{56}$ | 5-4 $y^e_{57}$ | 5-5 $y^o_{05}$ | 5-6 $y^o_{15}$ | 5-7 $y^e_{52}$ |
| Cell k=6 | 6-0 $y^e_{62}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^o_{06}$ | 6-7 $y^o_{16}$ |
| Cell k=7 | 7-0 $y^o_{17}$ | 7-1 $y^e_{72}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^o_{07}$ |

Even Matrix Read Counter Value q' = 2
Block ID (h)            0   1   2   3   4   5   6   7
Read Address (k)        6   7   0   1   2   3   4   5

Odd Matrix Write Counter Value q = 1
Block ID (h)            0   1   2   3   4   5   6   7
Word Select Offset      7   0   1   2   3   4   5   6
Write Address (k)       7   0   1   2   3   4   5   6

Fig. 10c

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y^o_{00}$ | 0-1 $y^o_{10}$ | 0-2 $y^o_{20}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^e_{17}$ | 1-1 $y^o_{01}$ | 1-2 $y^o_{11}$ | 1-3 $y^o_{21}$ | 1-4 $y^e_{13}$ | 1-5 $y^e_{14}$ | 1-6 $y^e_{15}$ | 1-7 $y^e_{16}$ |
| Cell k=2 | 2-0 $y^e_{26}$ | 2-1 $y^e_{27}$ | 2-2 $y^o_{02}$ | 2-3 $y^o_{12}$ | 2-4 $y^o_{22}$ | 2-5 $y^e_{23}$ | 2-6 $y^e_{24}$ | 2-7 $y^e_{25}$ |
| Cell k=3 | 3-0 $y^e_{35}$ | 3-1 $y^e_{36}$ | 3-2 $y^e_{37}$ | 3-3 $y^o_{03}$ | 3-4 $y^o_{13}$ | 3-5 $y^o_{23}$ | 3-6 $y^e_{33}$ | 3-7 $y^e_{34}$ |
| Cell k=4 | 4-0 $y^e_{44}$ | 4-1 $y^e_{45}$ | 4-2 $y^e_{46}$ | 4-3 $y^e_{47}$ | 4-4 $y^o_{04}$ | 4-5 $y^o_{14}$ | 4-6 $y^o_{24}$ | 4-7 $y^e_{43}$ |
| Cell k=5 | 5-0 $y^e_{53}$ | 5-1 $y^e_{54}$ | 5-2 $y^e_{55}$ | 5-3 $y^e_{56}$ | 5-4 $y^e_{57}$ | 5-5 $y^o_{05}$ | 5-6 $y^o_{15}$ | 5-7 $y^o_{25}$ |
| Cell k=6 | 6-0 $y^o_{26}$ | 6-1 $y^e_{63}$ | 6-2 $y^e_{64}$ | 6-3 $y^e_{65}$ | 6-4 $y^e_{66}$ | 6-5 $y^e_{67}$ | 6-6 $y^o_{06}$ | 6-7 $y^o_{16}$ |
| Cell k=7 | 7-0 $y^o_{17}$ | 7-1 $y^o_{27}$ | 7-2 $y^e_{73}$ | 7-3 $y^e_{74}$ | 7-4 $y^e_{75}$ | 7-5 $y^e_{76}$ | 7-6 $y^e_{77}$ | 7-7 $y^o_{07}$ |

Even Matrix Read Counter Value q' = 3
Block ID (h)       0  1  2  3  4  5  6  7
Read Address (k)   5  6  7  0  1  2  3  4

Odd Matrix Write Counter Value q = 2
Block ID (h)          0  1  2  3  4  5  6  7
Word Select Offset    6  7  0  1  2  3  4  5
Write Address (k)     6  7  0  1  2  3  4  5

Fig. 10d

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y_{00}^o$ | 0-1 $y_{10}^o$ | 0-2 $y_{20}^o$ | 0-3 $y_{30}^o$ | 0-4 $y_{04}^e$ | 0-5 $y_{05}^e$ | 0-6 $y_{06}^e$ | 0-7 $y_{07}^e$ |
| Cell k=1 | 1-0 $y_{17}^e$ | 1-1 $y_{01}^o$ | 1-2 $y_{11}^o$ | 1-3 $y_{21}^o$ | 1-4 $y_{31}^o$ | 1-5 $y_{14}^e$ | 1-6 $y_{15}^e$ | 1-7 $y_{16}^e$ |
| Cell k=2 | 2-0 $y_{26}^e$ | 2-1 $y_{27}^e$ | 2-2 $y_{02}^o$ | 2-3 $y_{12}^o$ | 2-4 $y_{22}^o$ | 2-5 $y_{32}^o$ | 2-6 $y_{24}^e$ | 2-7 $y_{25}^e$ |
| Cell k=3 | 3-0 $y_{35}^e$ | 3-1 $y_{36}^e$ | 3-2 $y_{37}^e$ | 3-3 $y_{03}^o$ | 3-4 $y_{13}^o$ | 3-5 $y_{23}^o$ | 3-6 $y_{33}^o$ | 3-7 $y_{34}^e$ |
| Cell k=4 | 4-0 $y_{44}^e$ | 4-1 $y_{45}^e$ | 4-2 $y_{46}^e$ | 4-3 $y_{47}^e$ | 4-4 $y_{04}^o$ | 4-5 $y_{14}^o$ | 4-6 $y_{24}^o$ | 4-7 $y_{34}^o$ |
| Cell k=5 | 5-0 $y_{35}^o$ | 5-1 $y_{54}^e$ | 5-2 $y_{55}^e$ | 5-3 $y_{56}^e$ | 5-4 $y_{57}^e$ | 5-5 $y_{05}^o$ | 5-6 $y_{15}^o$ | 5-7 $y_{25}^o$ |
| Cell k=6 | 6-0 $y_{26}^o$ | 6-1 $y_{36}^o$ | 6-2 $y_{64}^e$ | 6-3 $y_{65}^e$ | 6-4 $y_{66}^e$ | 6-5 $y_{67}^e$ | 6-6 $y_{06}^o$ | 6-7 $y_{16}^o$ |
| Cell k=7 | 7-0 $y_{17}^o$ | 7-1 $y_{27}^o$ | 7-2 $y_{37}^o$ | 7-3 $y_{74}^e$ | 7-4 $y_{75}^e$ | 7-5 $y_{76}^e$ | 7-6 $y_{77}^e$ | 7-7 $y_{07}^o$ |

Even Matrix Read Counter Value $q' = 4$

| Block ID (h) | 0 | 1 | 2 | 3 | 4 | 5 | 6 | 7 |
|---|---|---|---|---|---|---|---|---|
| Read Address (k) | 4 | 5 | 6 | 7 | 0 | 1 | 2 | 3 |

Odd Matrix Write Counter Value $q = 3$

| Block ID (h) | 0 | 1 | 2 | 3 | 4 | 5 | 6 | 7 |
|---|---|---|---|---|---|---|---|---|
| Word Select Offset | 5 | 6 | 7 | 0 | 1 | 2 | 3 | 4 |
| Write Address (k) | 5 | 6 | 7 | 0 | 1 | 2 | 3 | 4 |

Fig. 10e

| | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y^o_{00}$ | 0-1 $y^o_{10}$ | 0-2 $y^o_{20}$ | 0-3 $y^o_{30}$ | 0-4 $y^o_{40}$ | 0-5 $y^o_{50}$ | 0-6 $y^o_{60}$ | 0-7 $y^o_{70}$ |
| Cell k=1 | 1-0 $y^o_{71}$ | 1-1 $y^o_{01}$ | 1-2 $y^o_{11}$ | 1-3 $y^o_{21}$ | 1-4 $y^o_{31}$ | 1-5 $y^o_{41}$ | 1-6 $y^o_{51}$ | 1-7 $y^o_{61}$ |
| Cell k=2 | 2-0 $y^o_{62}$ | 2-1 $y^o_{72}$ | 2-2 $y^o_{02}$ | 2-3 $y^o_{12}$ | 2-4 $y^o_{22}$ | 2-5 $y^o_{32}$ | 2-6 $y^o_{42}$ | 2-7 $y^o_{52}$ |
| Cell k=3 | 3-0 $y^o_{53}$ | 3-1 $y^o_{63}$ | 3-2 $y^o_{73}$ | 3-3 $y^o_{03}$ | 3-4 $y^o_{13}$ | 3-5 $y^o_{23}$ | 3-6 $y^o_{33}$ | 3-7 $y^o_{43}$ |
| Cell k=4 | 4-0 $y^o_{44}$ | 4-1 $y^o_{54}$ | 4-2 $y^o_{64}$ | 4-3 $y^o_{74}$ | 4-4 $y^o_{04}$ | 4-5 $y^o_{14}$ | 4-6 $y^o_{24}$ | 4-7 $y^o_{34}$ |
| Cell k=5 | 5-0 $y^o_{35}$ | 5-1 $y^o_{45}$ | 5-2 $y^o_{55}$ | 5-3 $y^o_{65}$ | 5-4 $y^o_{75}$ | 5-5 $y^o_{05}$ | 5-6 $y^o_{15}$ | 5-7 $y^o_{25}$ |
| Cell k=6 | 6-0 $y^o_{26}$ | 6-1 $y^o_{36}$ | 6-2 $y^o_{46}$ | 6-3 $y^o_{56}$ | 6-4 $y^o_{66}$ | 6-5 $y^o_{76}$ | 6-6 $y^o_{06}$ | 6-7 $y^o_{16}$ |
| Cell k=7 | 7-0 $y^o_{17}$ | 7-1 $y^o_{27}$ | 7-2 $y^o_{37}$ | 7-3 $y^o_{47}$ | 7-4 $y^o_{57}$ | 7-5 $y^o_{67}$ | 7-6 $y^o_{77}$ | 7-7 $y^o_{07}$ |

Odd Matrix Write Counter Value q = 7
Block ID (h)            0  1  2  3  4  5  6  7
Word Select Offset      1  2  3  4  5  6  7  0
Write Address (k)       1  2  3  4  5  6  7  0

Fig. 10f

Odd Matrix

| Write Counter Value | Write Address | | | | | | | | Word Select Offset | | | | | | | |
|---|---|---|---|---|---|---|---|---|---|---|---|---|---|---|---|---|
| 0 | 0 | 1 | 2 | 3 | 4 | 5 | 6 | 7 | 0 | 1 | 2 | 3 | 4 | 5 | 6 | 7 |
| 1 | 7 | 0 | 1 | 2 | 3 | 4 | 5 | 6 | 7 | 0 | 1 | 2 | 3 | 4 | 5 | 6 |
| 2 | 6 | 7 | 0 | 1 | 2 | 3 | 4 | 5 | 6 | 7 | 0 | 1 | 2 | 3 | 4 | 5 |
| 3 | 5 | 6 | 7 | 0 | 1 | 2 | 3 | 4 | 5 | 6 | 7 | 0 | 1 | 2 | 3 | 4 |
| 4 | 4 | 5 | 6 | 7 | 0 | 1 | 2 | 3 | 4 | 5 | 6 | 7 | 0 | 1 | 2 | 3 |
| 5 | 3 | 4 | 5 | 6 | 7 | 0 | 1 | 2 | 3 | 4 | 5 | 6 | 7 | 0 | 1 | 2 |
| 6 | 2 | 3 | 4 | 5 | 6 | 7 | 0 | 1 | 2 | 3 | 4 | 5 | 6 | 7 | 0 | 1 |
| 7 | 1 | 2 | 3 | 4 | 5 | 6 | 7 | 0 | 1 | 2 | 3 | 4 | 5 | 6 | 7 | 0 |

=rd(q)    =sel(q)

Fig. 11

| | Blk h=0 | Blk h=1 | Blk h=2 | Blk h=3 | Blk h=4 | Blk h=5 | Blk h=6 | Blk h=7 |
|---|---|---|---|---|---|---|---|---|
| Cell k=0 | 0-0 $y^o_{00}$ | 0-1 $y^o_{10}$ | 0-2 $y^o_{20}$ | 0-3 $y^o_{30}$ | 0-4 $y^o_{40}$ | 0-5 $y^o_{50}$ | 0-6 $y^o_{60}$ | 0-7 $y^o_{70}$ |
| Cell k=1 | 1-0 $y^o_{71}$ | 1-1 $y^o_{01}$ | 1-2 $y^o_{11}$ | 1-3 $y^o_{21}$ | 1-4 $y^o_{31}$ | 1-5 $y^o_{41}$ | 1-6 $y^o_{51}$ | 1-7 $y^o_{61}$ |
| Cell k=2 | 2-0 $y^o_{62}$ | 2-1 $y^o_{72}$ | 2-2 $y^o_{02}$ | 2-3 $y^o_{12}$ | 2-4 $y^o_{22}$ | 2-5 $y^o_{32}$ | 2-6 $y^o_{42}$ | 2-7 $y^o_{52}$ |
| Cell k=3 | 3-0 $y^o_{53}$ | 3-1 $y^o_{63}$ | 3-2 $y^o_{73}$ | 3-3 $y^o_{03}$ | 3-4 $y^o_{13}$ | 3-5 $y^o_{23}$ | 3-6 $y^o_{33}$ | 3-7 $y^o_{43}$ |
| Cell k=4 | 4-0 $y^o_{44}$ | 4-1 $y^o_{54}$ | 4-2 $y^o_{64}$ | 4-3 $y^o_{74}$ | 4-4 $y^o_{04}$ | 4-5 $y^o_{14}$ | 4-6 $y^o_{24}$ | 4-7 $y^o_{34}$ |
| Cell k=5 | 5-0 $y^o_{35}$ | 5-1 $y^o_{45}$ | 5-2 $y^o_{55}$ | 5-3 $y^o_{65}$ | 5-4 $y^o_{75}$ | 5-5 $y^o_{05}$ | 5-6 $y^o_{15}$ | 5-7 $y^o_{25}$ |
| Cell k=6 | 6-0 $y^o_{26}$ | 6-1 $y^o_{36}$ | 6-2 $y^o_{46}$ | 6-3 $y^o_{56}$ | 6-4 $y^o_{66}$ | 6-5 $y^o_{76}$ | 6-6 $y^o_{06}$ | 6-7 $y^o_{16}$ |
| Cell k=7 | 7-0 $y^o_{17}$ | 7-1 $y^o_{27}$ | 7-2 $y^o_{37}$ | 7-3 $y^o_{47}$ | 7-4 $y^o_{57}$ | 7-5 $y^o_{67}$ | 7-6 $y^o_{77}$ | 7-7 $y^o_{07}$ |

Fig. 12

Odd Matrices

| Read Counter Value q' | Read Address | | | | | | | |
|---|---|---|---|---|---|---|---|---|
| | 0 | 1 | 2 | 3 | 4 | 5 | 6 | 7 |
| 0 | 0 | 0 | 0 | 0 | 0 | 0 | 0 | 0 |
| 1 | 1 | 1 | 1 | 1 | 1 | 1 | 1 | 1 |
| 2 | 2 | 2 | 2 | 2 | 2 | 2 | 2 | 2 |
| 3 | 3 | 3 | 3 | 3 | 3 | 3 | 3 | 3 |
| 4 | 4 | 4 | 4 | 4 | 4 | 4 | 4 | 4 |
| 5 | 5 | 5 | 5 | 5 | 5 | 5 | 5 | 5 |
| 6 | 6 | 6 | 6 | 6 | 6 | 6 | 6 | 6 |
| 7 | 7 | 7 | 7 | 7 | 7 | 7 | 7 | 7 |

Fig. 13

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | *0-0* free | *0-1* free | *0-2* free | *0-3* free | *0-4* free | *0-5* free | *0-6* free | *0-7* free |
| Cell k=1 | *1-0* $y^o_{71}$ | *1-1* $y^o_{01}$ | *1-2* $y^o_{11}$ | *1-3* $y^o_{21}$ | *1-4* $y^o_{31}$ | *1-5* $y^o_{41}$ | *1-6* $y^o_{51}$ | *1-7* $y^o_{61}$ |
| Cell k=2 | *2-0* $y^o_{62}$ | *2-1* $y^o_{72}$ | *2-2* $y^o_{02}$ | *2-3* $y^o_{12}$ | *2-4* $y^o_{22}$ | *2-5* $y^o_{32}$ | *2-6* $y^o_{42}$ | *2-7* $y^o_{52}$ |
| Cell k=3 | *3-0* $y^o_{53}$ | *3-1* $y^o_{63}$ | *3-2* $y^o_{73}$ | *3-3* $y^o_{03}$ | *3-4* $y^o_{13}$ | *3-5* $y^o_{23}$ | *3-6* $y^o_{33}$ | *3-7* $y^o_{43}$ |
| Cell k=4 | *4-0* $y^o_{44}$ | *4-1* $y^o_{54}$ | *4-2* $y^o_{64}$ | *4-3* $y^o_{74}$ | *4-4* $y^o_{04}$ | *4-5* $y^o_{14}$ | *4-6* $y^o_{24}$ | *4-7* $y^o_{34}$ |
| Cell k=5 | *5-0* $y^o_{35}$ | *5-1* $y^o_{45}$ | *5-2* $y^o_{55}$ | *5-3* $y^o_{65}$ | *5-4* $y^o_{75}$ | *5-5* $y^o_{05}$ | *5-6* $y^o_{15}$ | *5-7* $y^o_{25}$ |
| Cell k=6 | *6-0* $y^o_{26}$ | *6-1* $y^o_{36}$ | *6-2* $y^o_{46}$ | *6-3* $y^o_{56}$ | *6-4* $y^o_{66}$ | *6-5* $y^o_{76}$ | *6-6* $y^o_{06}$ | *6-7* $y^o_{16}$ |
| Cell k=7 | *7-0* $y^o_{17}$ | *7-1* $y^o_{27}$ | *7-2* $y^o_{37}$ | *7-3* $y^o_{47}$ | *7-4* $y^o_{57}$ | *7-5* $y^o_{67}$ | *7-6* $y^o_{77}$ | *7-7* $y^o_{07}$ |

Odd Matrix Read Counter Value q' = 1
Block ID (h)        0   1   2   3   4   5   6   7
Read Address (k)    1   1   1   1   1   1   1   1

Fig. 14a

|  | Blk 0 | Blk 1 | Blk 2 | Blk 3 | Blk 4 | Blk 5 | Blk 6 | Blk 7 |
|---|---|---|---|---|---|---|---|---|
| Cell k=0 | 0-0 $y^e_{00}$ | 0-1 $y^e_{01}$ | 0-2 $y^e_{02}$ | 0-3 $y^e_{03}$ | 0-4 $y^e_{04}$ | 0-5 $y^e_{05}$ | 0-6 $y^e_{06}$ | 0-7 $y^e_{07}$ |
| Cell k=1 | 1-0 $y^o_{71}$ | 1-1 $y^o_{01}$ | 1-2 $y^o_{11}$ | 1-3 $y^o_{21}$ | 1-4 $y^o_{31}$ | 1-5 $y^o_{41}$ | 1-6 $y^o_{51}$ | 1-7 $y^o_{61}$ |
| Cell k=2 | 2-0 $y^o_{62}$ | 2-1 $y^o_{72}$ | 2-2 $y^o_{02}$ | 2-3 $y^o_{12}$ | 2-4 $y^o_{22}$ | 2-5 $y^o_{32}$ | 2-6 $y^o_{42}$ | 2-7 $y^o_{52}$ |
| Cell k=3 | 3-0 $y^o_{53}$ | 3-1 $y^o_{63}$ | 3-2 $y^o_{73}$ | 3-3 $y^o_{03}$ | 3-4 $y^o_{13}$ | 3-5 $y^o_{23}$ | 3-6 $y^o_{33}$ | 3-7 $y^o_{43}$ |
| Cell k=4 | 4-0 $y^o_{44}$ | 4-1 $y^o_{54}$ | 4-2 $y^o_{64}$ | 4-3 $y^o_{74}$ | 4-4 $y^o_{04}$ | 4-5 $y^o_{14}$ | 4-6 $y^o_{24}$ | 4-7 $y^o_{34}$ |
| Cell k=5 | 5-0 $y^o_{35}$ | 5-1 $y^o_{45}$ | 5-2 $y^o_{55}$ | 5-3 $y^o_{65}$ | 5-4 $y^o_{75}$ | 5-5 $y^o_{05}$ | 5-6 $y^o_{15}$ | 5-7 $y^o_{25}$ |
| Cell k=6 | 6-0 $y^o_{26}$ | 6-1 $y^o_{36}$ | 6-2 $y^o_{46}$ | 6-3 $y^o_{56}$ | 6-4 $y^o_{66}$ | 6-5 $y^o_{76}$ | 6-6 $y^o_{06}$ | 6-7 $y^o_{16}$ |
| Cell k=7 | 7-0 $y^o_{17}$ | 7-1 $y^o_{27}$ | 7-2 $y^o_{37}$ | 7-3 $y^o_{47}$ | 7-4 $y^o_{57}$ | 7-5 $y^o_{67}$ | 7-6 $y^o_{77}$ | 7-7 $y^o_{07}$ |

Odd Matrix Read Counter Value q' = 1
Block ID (h)      0  1  2  3  4  5  6  7
Read Address (k)  1  1  1  1  1  1  1  1

Even Matrix Write Counter Value q = 0 $\triangleq$ Write Address
Block ID            0  1  2  3  4  5  6  7  → h
Write Address       0  0  0  0  0  0  0  0  → k
Word Select Offset  0  1  2  3  4  5  6  7

Fig. 14b

```
function [o0,o1,o2,o3,o4,o5,o6,o7] =
         reorder_output(sel,i0,i1,i2,i3,i4,i5,i6,i7)

% this function reorders data from the DPRAMs
    % switch sel case 0
            o0=i0;o1=i1;o2=i2;o3=i3;o4=i4;o5=i5;o6=i6;o7=i7;

case 1
            o0=i1;o1=i2;o2=i3;o3=i4;o4=i5;o5=i6;o6=i7;o7=i0;

case 2
            o0=i2;o1=i3;o2=i4;o3=i5;o4=i6;o5=i7;o6=i0;o7=i1;

case 3
            o0=i3;o1=i4;o2=i5;o3=i6;o4=i7;o5=i0;o6=i1;o7=i2;

case 4
            o0=i4;o1=i5;o2=i6;o3=i7;o4=i0;o5=i1;o6=i2;o7=i3;

case 5
            o0=i5;o1=i6;o2=i7;o3=i0;o4=i1;o5=i2;o6=i3;o7=i4;

case 6
            o0=i6;o1=i7;o2=i0;o3=i1;o4=i2;o5=i3;o6=i4;o7=i5;

case 7
            o0=i7;o1=i0;o2=i1;o3=i2;o4=i3;o5=i4;o6=i5;o7=i6;

end %switch end %function
```

Fig. 15

TRANSPOSE MEMORY AND METHOD THEREOF

FIELD OF THE INVENTION

The present invention relates to a transpose memory. In particular, the present invention relates to a transpose memory as applicable in computation of separable two dimensional transform implementations. More particularly, the present invention relates to a transpose memory as for instance applicable in computation of separable two dimensional Discrete Cosine Transform (DCT) implementations.

BACKGROUND

Transpose memories are used to provide an efficient and specifically adapted processing component to transpose N×N matrices. Transposition of N×N matrices is for instance used in two dimensional transform processes such as Discrete Cosine Transform for image and video compression.

Transposition of matrices may be implemented on the basis of conventional single port memory. However, when using conventional single port memory, first all elements of the matrix to be transposed has to be written into the single port memory before the transposed matrix can be read out thereof. This means, the transpose operation requires N×N dead cycles, when assuming that each matrix element is written on each cycle.

In another approach, two conventional single port memories may be used, each for buffering another matrix to be transposed. The data elements of a first matrix may be written into both memories, after which the data elements of the first matrix can be read out in transposed form from one memory and new data elements of a next matrix is being written to the other memory. During the next matrix write/read matrix operation the roles of memories are swapped—such a memory configuration is also designated as ping-pong memory. Conventional single ported random access memories can be utilized for the aforementioned ping-pong memory configuration. Dead cycles are avoided but at the cost of doubled memory capacity requirement.

Hence, there is a need for an improved transpose memory, which operates at a minimized memory capacity requirement and avoids dead cycles undesired to ensure a maximized throughput.

SUMMARY

According to an exemplary aspect of the present invention a transpose memory circuit is provided, which comprises a number of dual port memory blocks each having a number of storage cells each configured for storing one or more data words. The dual port memory blocks form a storage array for storing input matrices and outputting the input matrices in transposed form. A data input is provided to receive data words on each cycle and a data output is provided to output data words on each cycle. A read address logic is provided and configured to generate read addresses to address one cell of each dual port memory block to be read out. A write address logic is provided and configured to generate write addresses to address one cell of each dual port memory block to be written. In each cycle, one storage cell of each dual port memory block is addressed by the read address logic. The data words each stored in one of the addressed storage cells of each dual port memory block are read out from and outputted through the data output. In each cycle, one storage cell of each dual port memory block is addressed by the write address logic. The addressed storage cells have been read out in a preceding cycle and the data words received through the data input are written into the addressed storage cells. The transpose memory circuit is provided and configured to receive an input matrix and to output the transposed input matrix in subsequent cycles without any dead cycles interposed between them. In particular, the storage cells, which are read out in a cycle, are addressed for being written with received data words in a subsequent next cycle.

According to an exemplary embodiment of the present invention, the transpose memory comprises a number N of dual port memory blocks each having a number N of storage cells each configured for storing one data word. The dual port memory blocks form an N×N storage array for storing N×N input matrices Y and outputting the N×N input matrices Y in transposed form $Y^T$. A data input is provided to receive N data words on each cycle (the N data words forming an N-word data input vector) and a data output is provided to output N data words on each cycle (the outputted N data words forming an N-word data output vector). A read address logic is provided and configured to generate read addresses to address one cell of each dual port memory block h to be read out, where h=0, . . . , N−1. A write address logic is provided and configured to generate write addresses to address one cell k of each dual port memory block to be written, where k=0, . . . , N−1. In each cycle, one storage cell of each dual port memory block is addressed by the write address logic, wherein the addressed storage cells have been read out in an instantaneous preceding cycle and into which storage cells data words received through the data input are written. The transpose memory circuit is provided and configured to receive an N×N input matrix Y and to output the N×N transposed input matrix $Y^T$ in instantaneous next cycles without any dead cycles interposed between them.

According to an exemplary embodiment of the present invention, a bus combiner is provided and configured to receive N data words at each cycle and to drive the received N data words on an N-words wide concatenated data bus. A select multiplexer is provided, which couples the N-words wide concatenated data bus to the dual port memory blocks. The select multiplexer is adapted to select one data word out of the N data words driven on the N-words wide concatenated data bus. The select multiplexer provides the selected data word to be written into a storage cell of a dual port memory block.

According to an exemplary embodiment of the present invention, a word reorderer is provided and configured to receive N data words read out from the dual port memory blocks and to rearrange the sequence order of the received N data words.

According to an exemplary embodiment of the present invention, the read logic distinguishes or classifies succeeding input matrices out of a sequence of matrices Y into even input matrices Ye; and odd input matrices Yo;. Each dual port memory block is identified by an identifier h, where h=0, . . . , N−1 and wherein each storage cell is identified by an identifier k, where k=0, . . . , N−1.

According to an exemplary embodiment of the present invention, the N data words received in the cycle associated with a write counter value q represent a row or column of the even input matrix Ye;. In case an even input matrices Ye; is to be inputted, the write address logic is configured to assign the N data words to the dual port memory blocks h in accordance with a select sequence sele;h(q) defining, which received data word is fed to which dual port memory block h. The select sequence sele;h(q) is defined on an initial select sequence sele;h(q)={0, . . . , N−1} cyclically shifted right by q sequence elements. The write address logic addresses the storage cells k=q of the dual port memory blocks h for writing the data words.

According to an exemplary embodiment of the present invention, the N data words received in a write cycle associated with a write counter value q represent a row or column of the odd input matrix Yo;. In case an odd input matrices Yo; is to be inputted, the write address logic is configured to assign the N data words to the dual port memory blocks h in accordance with a select sequence selo;h(q) defining, which received data word is fed to which dual port memory block h. The select sequence selo;h(q) is defined on an initial select sequence selo;h(q)={0, ..., N−1} cyclically shifted right by q sequence elements. The write address logic is configured to address the storage cells k of the dual port memory blocks h for writing the data words in accordance with a write address sequence wro;h(q), which defines the storage cell to be addressed. The write address sequence wro;h(q) is obtained from the initial sequence {0, 1, 2, ..., N−1} cyclically shifted right by q sequence elements.

According to an exemplary embodiment of the present invention, in case a transposed even input matrix Ye; is to be read, the read address logic is configured to address in the cycle associated with the read counter value q' the storage cells k of the dual port memory blocks h for reading the data words in accordance with a read address sequence rde;h(q'), which defines the storage cell to be addressed. The read address sequence rde;h(q') is obtained from the initial sequence {0, 1, 2, ..., N−1} cyclically shifted right by q sequence elements.

According to an exemplary embodiment of the present invention, in case a transposed odd input matrix Yo; is to be the read, the address logic is configured to address in the cycle associated with the read counter value q' the storage cells k=q' of the dual port memory blocks h for reading the data words.

According to an exemplary embodiment of the present invention, the transpose memory circuit or at least a part of the functionality and components of the transpose memory circuit is designed as hardware and implemented on the basis of one or more hardware components. Such hardware components may comprise or may be part of one or more integrated circuits/circuitries; one or more application specific integrated circuits (ASICs); and/or one or more field-programmable gate arrays (FPGAs).

According to another exemplary aspect of the present invention, a method of operating a transpose memory is provided. A sequence of input matrices is received and a sequence of transposed input matrices is outputted by a transpose memory. The transpose memory comprises a number of dual port memory blocks each having a plurality of storage cells each configured for storing one data word. The dual port memories form a storage array for storing the input matrices and outputting transposed input matrices. Each input matrix is received cycle-wise and the transposed input matrix is outputted in subsequent cycles without any dead cycles interposed between them.

In each cycle, data words of a transposed input matrix are outputted from a transpose memory. One storage cell of each dual port memory block is addressed and the data words stored in the addressed storage cell of each dual port memory blocks are read out.

In each cycle data words of an input matrix to be transposed is received by the transpose memory. One storage cell of each dual port memory block is addressed have been read out in a preceding cycle and the received data words are written to the addressed storage cells.

According to an exemplary embodiment of the present invention, a sequence of N×N input matrices Y is received and a sequence of transposed N×N input matrices $Y^T$ is outputted by a transpose memory. The transpose memory comprises a number N of dual port memory blocks each having a number N of storage cells each configured for storing one or more data words. The dual port memories form an N×N storage array for storing N×N input matrices Y and outputting transposed N×N input matrices Y. Each N×N input matrix Y is received in N cycles and the transposed N×N input matrix Y is outputted in instantaneous next N cycles without any dead cycles interposed between them. In each cycle, N data words of a transposed N×N input matrix $Y^T$ are outputted from a transpose memory. One storage cell of each dual port memory block is addressed. The data words stored in the addressed storage cells are read out from the dual port memory blocks. Each data word is read out from one storage cell of each dual port memory block. In each cycle, N data words of an N×N input matrix Y to be transposed are received by the transpose memory. One storage cell of each dual port memory block is addressed. The addressed storage cells have been read out in a preceding cycle. The received N data words are written to the addressed storage cells. In particular, the addressed storage cells have been read out in an instantaneously preceding cycle.

According to an exemplary embodiment of the present invention, the N data words of an N×N input matrix to be transposed are received from an N-words wide concatenated data bus, on which the N data words are driven. One data word out of the N data words driven on the N-words wide concatenated data bus is selected and provided to each dual port memory block. The selected data word is written into a storage cell of the respective dual port memory block.

According to another exemplary aspect of the present invention a processor is provided, which comprises a transpose memory circuit, which comprises a number of dual port memory blocks each having a number of storage cells each configured for storing one or more data words. The dual port memory blocks form a storage array for storing input matrices and outputting the input matrices in transposed form. A data input is provided to receive data words on each cycle and a data output is provided to output data words on each cycle. A read address logic is provided and configured to generate read addresses, each of which addresses one storage cell of a respective dual port memory block to be read out. A write address logic is provided and configured to generate write addresses, which address one storage cell of a respective dual port memory block to be written. In each cycle, one storage cell of each dual port memory block is addressed by the read address logic. The data words, each of which stored in one of the addressed storage cells, are read out from the dual port memory blocks and outputted through the data output. In each cycle, one storage cell of each dual port memory block is addressed by the write address logic. The addressed storage cells have been read out in a preceding cycle and the data words received through the data input are written into the addressed storage cells. The transpose memory circuit is provided and configured to receive an input matrix and to output the transposed input matrix in subsequent cycles without any dead cycles interposed between them.

According to an exemplary embodiment of the present invention, the processor is a processor configured for image processing. In particular, the processor may be designed for still image compressing and/or decompressing. More particularly, the processor may be designed video frame compressing and/or decompressing. The processor may further be an application specifically adapted processor or a processor comprising an application specifically adapted processor subcomponent.

According to another exemplary aspect of the present invention a processing device is provided, which comprises a transpose memory circuit, which comprises a number of dual port memory blocks each having a number of storage cells each configured for storing one or more data words. The dual port memory blocks form a storage array for storing input matrices and outputting the input matrices in transposed form. A data input is provided to receive data words on each cycle and a data output is provided to output data words on each cycle. A read address logic is provided and configured to generate read addresses to address one cell of each dual port memory block to be read out. A write address logic is provided and configured to generate write addresses to address one cell of each dual port memory block to be written. In each cycle, one storage cell of each dual port memory block is addressed by the read address logic. The data words, each of which stored in the addressed storage cells, are read out from the dual port memory blocks and outputted through the data output. In each cycle, one storage cell of each dual port memory block is addressed by the write address logic. The addressed storage cells have been read out in a preceding cycle and the data words received through the data input are written into the addressed storage cells. The transpose memory circuit is provided and configured to receive an input matrix and to output the transposed input matrix in subsequent cycles without any dead cycles interposed between them.

According to an exemplary embodiment of the present invention, the processing device is one device out of a group including a server processing device, a desktop processing device, a portable processing device, a portable processing device capable for wireless communication, and a network processing device.

BRIEF DESCRIPTION OF THE DRAWINGS

These and other additional objects and features of the present invention will become readily apparent when the same are set forth in greater detail in the accompanying detailed description of the embodiments with reference being made to the drawings in which like reference numerals represent like or similar parts throughout and in which:

FIG. 2 depicts schematically a storage cell matrix representation of the transpose memory according to an exemplary embodiment of the present invention;

FIG. 5a to 5e illustrates schematically storage states of the transpose memory on the basis of the storage cell matrix representation during writing an even input matrix according to an exemplary embodiment of the present invention;

FIG. 6 illustrates schematically write addresses and word select offsets as generated in each even matrix write cycle according to an exemplary embodiment of the present invention;

FIG. 7a to 7e illustrates schematically storage states of the transpose memory on the basis of the storage cell matrix representation during reading an even input matrix according to an exemplary embodiment of the present invention;

FIG. 8 illustrates schematically read addresses as generated in each even matrix read cycle according to an exemplary embodiment of the present invention;

FIG. 9a illustrates schematically the sequence orders of the vector elements on input side and output side of the word reorderer according to an exemplary embodiment of the present invention;

FIG. 9b illustrates schematically reordering sequences as applied by the word reorderer according to an exemplary embodiment of the present invention;

FIG. 10a to f illustrates schematically storage states of the transpose memory on the basis of the storage cell matrix representation during reading an even input matrix and simultaneously writing an odd input matrix according to an exemplary embodiment of the present invention;

FIG. 11 illustrates schematically write addresses and word select offsets as generated in each odd matrix write cycle according to an exemplary embodiment of the present invention;

FIG. 12 illustrates schematically storage states of the storage cell matrix representation during reading an odd input matrix and according to an exemplary embodiment of the present invention;

FIG. 13 illustrates schematically read addresses as generated in each odd matrix read cycle according to an exemplary embodiment of the present invention;

FIG. 14a to 14b illustrates schematically storage states of the storage cell matrix representation during reading an odd input matrix and simultaneously writing an even input matrix according to an exemplary embodiment of the present invention;

FIG. 15 illustrates schematically a software based implementation of the word reorderer according to an exemplary embodiment of the present invention.

DETAILED DESCRIPTION OF THE INVENTION

Figure 1:
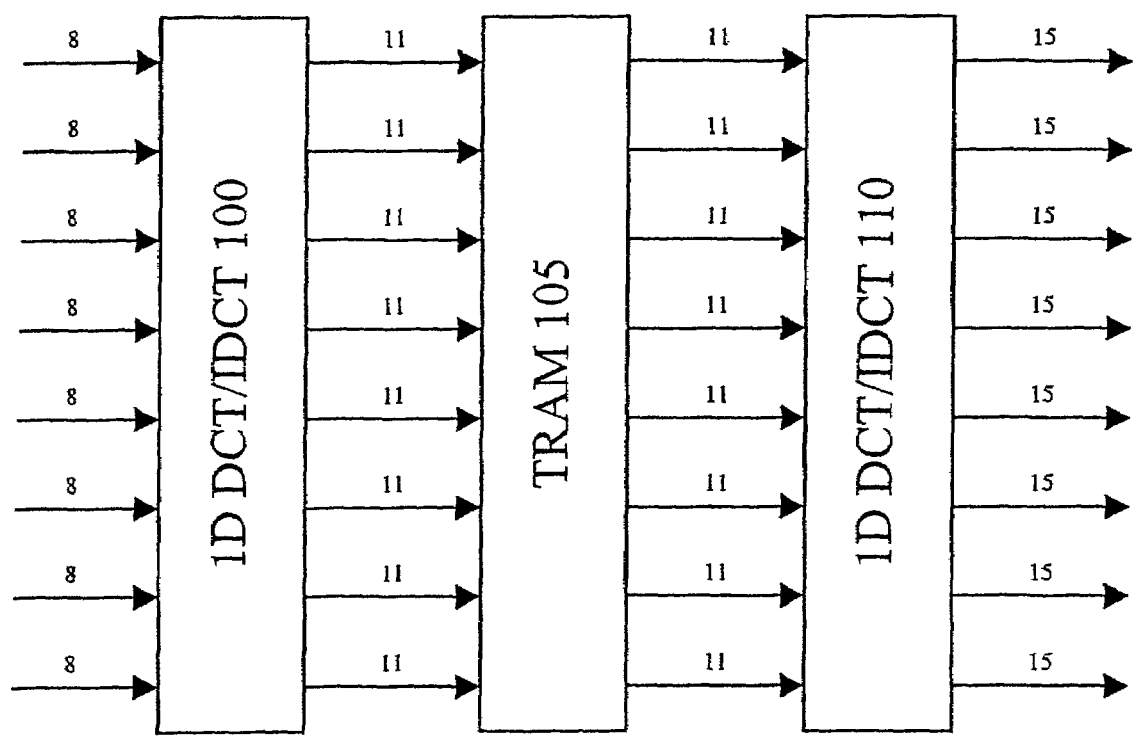
FIG. 1 depicts schematically a block diagram of a separable two dimensional transform processing component comprising two one-dimensional transform blocks and a transpose memory (TRAM) according to an exemplary embodiment of the present invention.

The following embodiments are described in sufficient detail to enable those skilled in the art to practice the invention, and it is to be understood that the embodiments may be combined, or that other embodiments may be utilized and that structural, logical, and electrical changes may be made without departing from the spirit and scope of the present invention. It should be noted that references to "an", "one", or "various" embodiments in this document are not necessarily to the same embodiment, and such references contemplate more than one embodiment.

This document discusses, among other things, a transpose memory. In particular, the operation of the transpose memory is described in detail. The transpose memories according to embodiments of the present invention may be used in compressing video signals or still image signals. For example, it has been shown that two dimensional (2-dim) Discrete Cosine Transform is a transform, which is suited for image data compression. The two dimensional N×N Discrete Cosine Transform (DCT) is a real separable transform defined as $$z_{mn} = \frac{2}{N} c(m)c(n) \sum_{i=0}^{N-1} \sum_{j=0}^{N-1} x_{ij} \cos\left(\frac{(2i+1)m\pi}{2N}\right) \cos\left(\frac{(2i+1)n\pi}{2N}\right) \quad (1)$$

where $x_{ij}$ are input elements in N×N matrix, with i, j=0, . . . , N−1 and where $z_{mn}$ are output elements in an N×N matrix with n, m=0, . . . , N−1 and where $$c(m), c(n) = \begin{cases} \frac{1}{\sqrt{2}}, & m = 0, n = 0 \\ 1, & \text{otherwise} \end{cases}$$

The Inverse Discrete Cosine Transform (IDCT) is defined as:

$$x_{ij} = \frac{2}{N} \sum_{m=0}^{N-1} \sum_{n=0}^{N-1} c(m)c(n)z_{mn} \cos\left(\frac{(2j+1)m\pi}{2N}\right) \cos\left(\frac{(2j+1)n\pi}{2N}\right) \quad (2)$$

The matrix expression for equation (1) is $$Z = CXC^T \quad (3)$$

where X is the input data matrix, C is the cosine transform matrix and $C^T$ is the transpose of the matrix C. The equation (3) can be separated into one dimensional transforms as follows:

$$Y = CX \quad (5)$$

$$Z = YC^T \quad (6)$$

where Y is an intermediate product matrix or intermediate matrix. Likewise from equation (6) the following is also true:

$$Z = CY^T \quad (6a)$$

The computation of the Inverse Discrete Cosine Transform (IDCT) is similar to those of the DCT except that the matrix $C^T$ is substituted for the matrix C and vice versa. This means for Inverse Discrete Cosine Transform (IDCT), we have:

$$X = C^T ZC \quad (7)$$

$$X = C^T Y \quad (8)$$

$$X = Y^T C \quad (8a)$$

Since both the Discrete Cosine Transform (DCT) and the Inverse Discrete Cosine Transform (IDCT) are separable, the row-column decomposition technique can be applied to compute the two dimensional transformations. As shown, by applying row-column decomposition the above transforms are separated into two sequential one dimensional transformations. The first one dimensional transformation transforms the N×N matrix in row (or column) order to produce the intermediate matrix. A second one dimensional transformation is then applied on the intermediate N×N matrix in columns (or rows) order to generate the final 2 dimensional transformed N×N matrix.

In the following, a transpose memory according to an exemplary embodiment of the present invention will be described in more detail. For the sake of illustration and intelligibility, the transpose memory will be described in view of the aforementioned, separable, two dimensional Discrete Cosine Transform/Inverse Discrete Cosine Transform. Moreover, the transpose memory will be described on the basis of an 8×8 two dimensional Discrete Cosine Transform/Inverse Discrete Cosine Transform, in which the transposed 8×8 intermediate product matrix has to be computed for being supplied to the second one-dimensional transformation. Those skilled in the art will understand on the basis of the following detailed description that the invention is not limited to any specifically sized matrix. The inventive core concept, which will be fully understood by those skilled in the art when reading the following description, allows for fully pipelined transposing any N×N matrices. References to a more general case are given throughout the following description.

As shown in FIG. 1, an exemplary transform processor stage according to an exemplary embodiment of the present invention provides the functionality to compute an 8×8-word (point) forward Discrete Cosine Transform (DCT) or Inverse Discrete Cosine Transform (IDCT) using row-column decomposition technique. The 8×8 two dimensional Discrete Cosine Transform (DCT)/Inverse Discrete Cosine Transform (IDCT) is subdivided into two 8-word, one dimensional transform blocks 100, 110 and a dual port (DP) transform random access memory (TRAM) 105. An 8×8 matrix is fed into the first one dimensional transform block 100. The transformed rows each having 8 words are then stored in the transpose RAM (TRAM) 105. Once all eight rows have been processed and stored, the intermediate 8×8-word data matrix is read out in column order. The intermediate 8×8-word data matrix is fed into a second one dimensional transform block 110, which generates the complete 8×8-word two dimensional transform matrix, in column order.

According to an exemplary embodiment of the present invention, the one dimensional transform blocks 100, 110 are implemented in a full parallel way. This means that a new 8×8-word input data matrix is fed into the first one dimensional transform block 100. Herein, each data word of the input data matrix has for example a width of 8 bits. A set of 8 words of the 8×8-word input data matrix, i.e. an 8-word vector of the 8×8-word input data matrix, is fed into the first one dimensional transform block on each clock cycle. After latency due to transform processing, the transform block 100 being capable for fully parallel processing of 8 words outputs a set of 8 words of the intermediate data matrix, i.e. an 8-word data vector of the intermediate 8×8 word data matrix on each cycle. Herein, each data word of the intermediate data matrix has for example a width of 11 bits.

The 8-word data vector of the intermediate 8×8 word data matrix outputted by the first transform block 100 is stored on each cycle in the transform memory (TRAM) 105. The transpose memory (TRAM) 105 accepts on each clock cycle 8 data words for being stored and provides on each clock cycle 8 data words for being read out. Herein, the transpose memory (TRAM) 105 is capable for performing matrix transposition of parallel 8-word data in a streaming mode without pipeline stalls or any other undesired interrupts. The fully pipelined transpose memory (TRAM) 105 accepts an 8-word data vector for being stored and provides an 8-word data vector for being read out on each clock cycle. Since the intermediate 8×8-word data matrix is structured of 8 sets of 8-word data vectors, the transpose memory (TRAM) 105 has a latency of 8 clock cycles, which are required to feed the intermediate 8×8-word data matrix into the transpose RAM (TRAM) 105 and the read out the transposed intermediate 8×8-word data matrix from the transpose RAM (TRAM) 105.

Hence, an 8-word data vector provided by the transform memory (TRAM) 105 for being read-out on each cycle is fed into the second one dimensional transform block 110. The implementation of the second one dimensional transform block 110 corresponds to that of the first one fully parallel dimensional transform block 100. This means that a set of 8 words of the transposed intermediate 8×8-word data matrix, i.e. an 8-word data vector, is fed into the second one dimensional transform block 110 on each clock cycle. Finally, the second one dimensional transform block 110 generates the complete 8×8-word two dimensional transform matrix.

According to an exemplary embodiment of the present invention, the transpose memory (TRAM) is implemented on the basis of 8 dual port memory (DPRAM) blocks (Blk) 0 to 7. Each DPRAM block (Blk) has the capacity for storing 8 data words. Hence, the transpose memory is capable for storing 8×8 data words (equal to 64 data words) in total. The indexing, which will be used for referring to the different storage cells of transpose memory (TRAM) comprising the DPRAM blocks 0 to 7 is schematically illustrated in FIG. 2. An index denotation k-h refers to the storage cell k of the DPRAM block h, where k, h=0, . . . , 7, herein.

A more general transpose memory (TRAM) according to an exemplary embodiment of the present invention may be implemented on the basis of N dual port memory (DPRAM) blocks 0 to N−1, wherein each DPRAM block (Blk) has the capacity for storing N data words. This transpose memory (TRAM) is capable for storing N×N data words (equal to $N^2$ data words) in total. Correspondingly, the transpose memory (TRAM) comprising N×N storage cells in total is applicable for transposing N×N matrices or A×B matrices, where A, B≦N.

Figure 3:
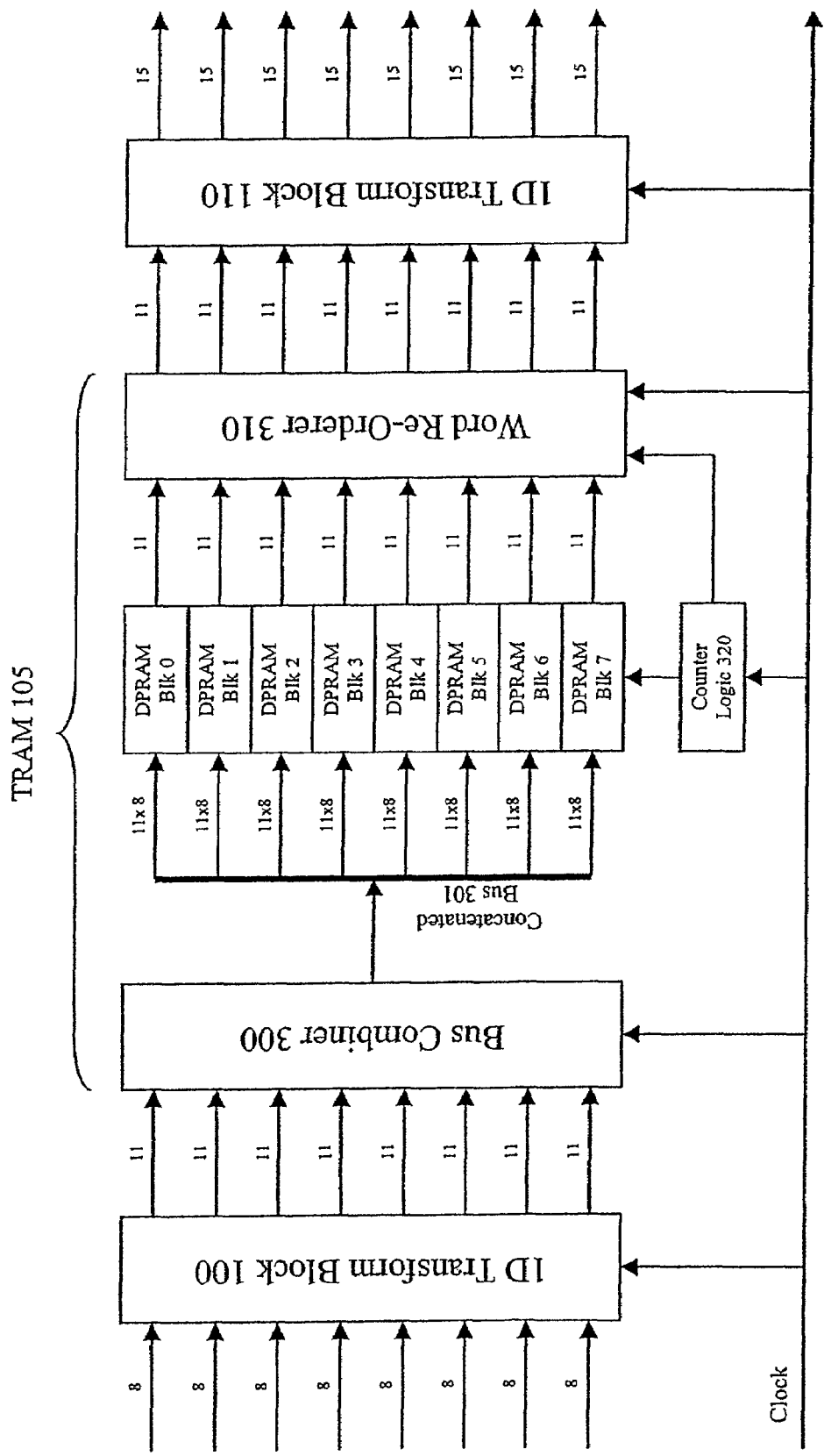
FIG. 3 depicts schematically a further block diagram of a separable two dimensional transform processing component comprising two one-dimensional transform blocks and a more detail implementation of the transpose memory (TRAM) according to an exemplary embodiment of the present invention.

According to FIG. 3, a schematic block diagram of a transpose memory (TRAM) according to an exemplary embodiment of the present invention is illustrated in more detail.

The 8-word data vector outputted by the first fully parallel transform block 100 is fed into a bus combiner 300, which concatenates the eight data words of the 8-word data vector and drives the concatenated eight data words on an 8-word wide concatenated bus 301, which couples to the DPRAM blocks (Blk) 0 to 7 of the transpose memory (TRAM) 105. Each of the DPRAM blocks (Blk) 0 to 7 is configured to select one data word out of the eight concatenated data words driven on the 8-word wide concatenated bus 301 and stores the selected data word into one of the storage cells of each DPRAM block (Blk) 0 to 7. Each DPRAM block (Blk) 0 to 7 stores one data word on each clock cycle. On the output side of the DPRAM blocks 0 to 7, a word reorderer 310 is arranged, which is configured for rearranging a sequence of eight data words, each data word outputted by one of the DPRAM blocks (Blk) 0 to 7 on each clock cycle. The rearranged eight data words are outputted by the word reorderer 310 in form of an 8-word data vector, which is then fed into the second fully parallel transform block 110.

Figure 4:
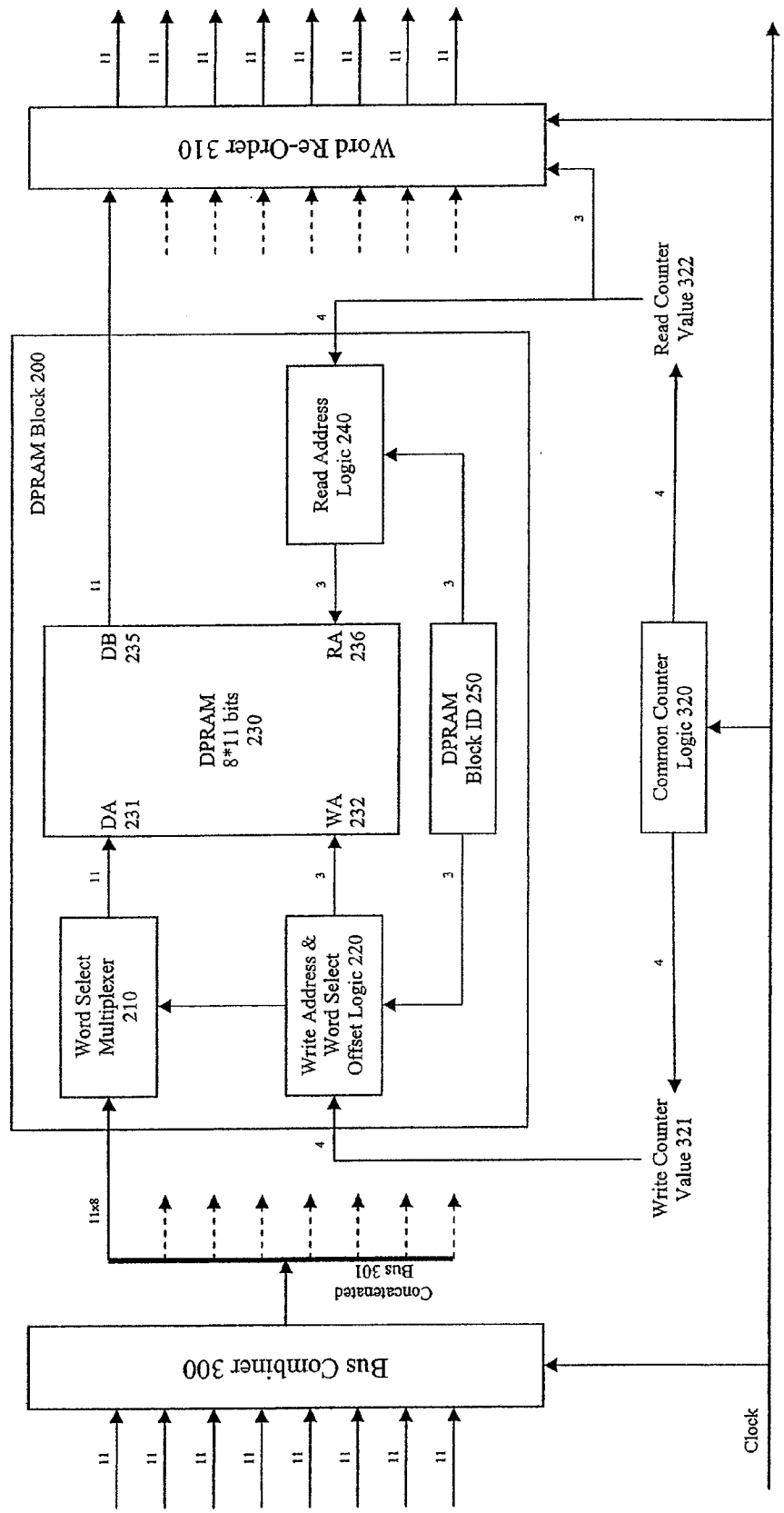
FIG. 4 depicts schematically a block diagram of a dual port memory block of the transpose memory (TRAM) according to an exemplary embodiment of the present invention.

According to FIG. 4, a schematic block diagram of one of the DPRAM blocks 0 to 7 comprised in the transpose memory (TRAM) according to an exemplary embodiment of the present invention is illustrated in more detail. The DPRAM block 200 representing illustratively one of the DPRAM blocks 0 to 7 comprises a word select multiplexer 210, which may be implemented as a 8 to 1 multiplexer for selecting one data word out of the eight data words driven at each clock cycle on the 8-word wide concatenated data bus 301 coupling the bus combiner 300 to the word select multiplexer 210 on input side of the DPRAM block 200.

A data word selected by the word select multiplexer 210 is fed via data input DA 231 into the DPRAM component 230, which provides a capacity of 8 storage cells each for storing one data word. Herein, each storage cell of the DPRAM component 230 accepts for instance a data word having a width of 11 bits at maximum. A write address and word select offset logic 220 is coupled to the word select multiplexer 210 and the write address input WA 232 of the DPRAM component 230. The write address and word select offset logic 220 controls the operation of the word select multiplexer 210, which is configured to select one data word of the eight concatenated data words driven by the word combiner 300 on the 8-word wide concatenated bus 301. The write address and word select offset logic 220 further controls into which storage cell of the DPRAM component 230 the one selected data word is written. The storage cell, in which the data word fed into the DPRAM component 230 is written, is indicated via the write address WA input 232 of the DPRAM component 230.

A common write counter value 321 is supplied to the write address and word select offset logic 220 by a common counter logic 320 of the transpose memory (TRAM), which signals the write counter value on a common write counter bus to all DPRAM blocks 0 to 7 of the transpose RAM (TRAM) 105. The write address and word select offset logic 220 generates a write address and word select offset on the basis of the write counter value. Each DPRAM block 200 has assigned an identifier 250, which identifies each DPRAM block 0 to 7 comprised by the transpose RAM (TRAM) 105. The identifiers of the DPRAM blocks should be unique within the transpose memory (TRAM). The identifier may be a numeral identifier and in particular a numeral identifier out of the set of identifiers (ID) h=0, . . . , 7 as already defined above. The identifier is provided as an input parameter to the write address and word select offset logic 220.

A read address logic 240, which receives a common read counter value 322 from the common counter logic 320 of the transpose memory (TRAM) 105, controls the data output of the DPRAM component 230. The common counter logic 320 signals the read counter value 322 on a common read counter bus to all the DPRAM blocks 0 to 7 of the transpose RAM. The read address logic 240 generates a read address, which is supplied to a read address input RA 236 of the DPRAM component 230. The read address is generated by the read address logic 240 on the basis of the read counter value 322. A data word stored in the memory cell of the DPRAM 230 and addressed by the read address offset is outputted through the data output DB 235, which couples the DPRAM component 230 and the DPRAM block 200 to the word reorderer 310, respectively. On each clock cycle, eight data words are available at the outputs of the DPRAM block 0 to 7 comprised by the transpose RAM (TRAM) 105. The eight data words outputted on each cycle by the DPRAM blocks 0 to 7 are feed into the word reorderer 310, which reorders the sequence of the outputted data words and feeds the reordered data words into the second fully parallel transform block 110.

The detailed operation of the aforementioned components will become more comprehensible on the basis of the following description.

The storage cells of the transpose memory (TRAM) 105 is shown in the following figures in form of a schematic storage matrix, where each matrix element of a column of the storage matrix represents one of the storage cells 0 to 7 of one DPRAM block 0 to 7. This means that the storage cell k of the DPRAM block h is indexed with the help of the denotation "k-h" as illustratively depicted in FIG. 2.

In a more general exemplary embodiment, the transpose memory (TRAM) comprises N DPRAM blocks 0 to N−1 each in turn comprising N storage cells 0 to N−1. The transpose memory (TRAM) having N×N storage cells in total is suited for transposing an N×N input matrix Y, which comprises N×N values y ;ij, where i, j=0, ..., N−1. Each matrix element y ;ij is coded as a word having a defined bit width.

For the sake of illustration, the input matrix Y comprises 8×8 values y ;ij, where i, j=0, ..., 7 and each value y ;ij has for instance a width of 11 bits according to the above illustrated DPRAM blocks 0 to 7. It should be further assumed that index i is a row index of the input matrix Y and index j is a column index of the input matrix Y.

The transpose memory (TRAM) 105 is configured to transpose the input matrix Y including the matrix elements y ;ij, where i, j=0, ..., N−1 to the transposed output matrix $Y^T$ including the matrix elements y ;ji, where j, i=0, ..., N−1. It is further assumed that a sequence of input matrixes ;mY (m=0, 1, ...) should be transposed by the transpose memory (TRAM) 105. A sequence number is indicated by the prefixed index representing the sequence number. The sequence of input matrixes ;mY is classified into even matrixes ;2nYe; and odd matrixes ;2n+1 Yo; (where n=0, 1, ... and m=2n, 2n+1), which should be arranged in a consecutive, cyclic order in the matrix sequence ;mY.

When referring back to the transpose processor stage illustrated in FIG. 1, the input matrixes ;mY represent for instance one dimensional transformed intermediate 8×8 matrixes outputted by the first one dimensional transform block 100. For the sake of illustration, the even matrixes Ye; are indexed by a superscript index "e" and the odd matrixes Yo; are indexed by a superscript index "o". A sequence of matrixes ;mY may be denoted as following:

;2nYe;, ;2n+1Yo;, ;2n+2Ye;, ;2n+3Yo;, ..., ;2n+pYe;, ;2n+2p+1Yo;, ... and

;2nye;ij, ;2n+1yo;ij, ;2n+2ye;ij, ;2n+3yo;ij, ..., ;2n+2pye;ij, ;2n+2p+1yo;ij, ..., respectively, where n, p=0, 1, ....

It will be understood from the following description that the write addressing scheme as well as the read addressing scheme, which are generated on the basis of the counter signals of the common counter logic 320, differ among even matrixes Ye; and odd matrices Yo;. The designations "odd" and "even" are made for the sake of classification two consecutive input matrixes in the sequence of matrixes. It should be understood that the invention is not limited thereto. Other designations may be likewise used in order to distinguish two consecutive matrices in the sequence of matrices.

[Even Matrix Transpose Operation]

First, operation of the transpose memory (TRAM) 105 will be described with reference to a transpose operation of a first matrix Y. The transpose operation may be divided into a first stage of inputting/writing of the matrix elements y ;ij into the transpose memory (TRAM) 105 and a second stage of outputting/reading the transposed matrix element y ;ji from the transpose memory (TRAM) 105. Moreover, the operation of the transpose memory (TRAM) 105 will be described with reference to the transposition of the even matrix Ye; being the first matrix in a sequence of matrices ;nY. Those skilled in the art will understand on the basis of the following description that the first matrix may be an odd matrix Yo;, alternatively.

At an initial state, the storage cells of the transpose memory (TRAM) 105 may store any arbitrary values. Upon indication of a reset, the storage cells of the transpose memory (TRAM) 105 may store predefined reset value(s), for instance the storage cells may be reset to zero.

[Even Matrix Write Operation]

In a first cycle of the even matrix writing stage, a first set of eight data words representing the matrix elements ye;00 to ye;07, i.e. the first row of the exemplary 8×8 input matrix Ye;, is driven by the bus combiner 300 on the concatenated data bus 301 in their original sequence order (i.e. with increasing column index). In the first cycle, a common write counter value q=0 is signaled by the common counter logic to the DPRAM blocks 0 to 7. For the sake of simplicity, the cycle, in which the common write counter value q is signaled, may be also designated as write cycle q in the following. The first cycle of a matrix writing stage is designated as write cycle q=0. In the following, it will be understood more completely that in each cycle, a writing operation as well as a reading operation are carried out substantially simultaneously. Correspondingly, in each cycle, a common write counter value and a common read counter value are signaled to the DPRAM blocks.

The data words may be fed into the bus combiner 300 via eight parallel data word inputs thereof. The eight data words on the concatenated data bus 301 have to be written into the transpose memory (TRAM) 105. The common write counter value q, which is reset to q=0 at the start of the writing stage, is signaled by the common counter logic 320 through the common write counter bus to the DPRAM blocks 0 to 7. The write address and word select offset logics 220 provided with respective DPRAM blocks 0 to 7 generate individual word select offsets and write addresses. An individual word select offset enables the word select multiplexer 210 provided with each DPRAM block 0 to 7 to select one specific data word out of the eight concatenated data words on the 8-word wide concatenated bus 301. The data words representing the matrix elements ye;00, ..., ye;07 are selected by the DPRAM blocks h=0 to 7 in accordance with their original sequence order. This means the word select multiplexer of the DPRAM block h=0 selects the data word representing the matrix elements ye;00, the word select multiplexer of the DPRAM block h=1 selects the data word representing the matrix elements ye;01, ..., and the word select multiplexer of the DPRAM block h=7 selects the data word representing the matrix elements ye;07. The word select multiplexer of the DPRAM block h selects the data word representing the matrix elements ye;0h. In accordance with the aforementioned word select offset scheme, a word select offset sequence sele;h(q=0)={0, 1, 2, 3, 4, 5, 6, 7} can be defined, which includes the individual word select offsets of the DPRAM blocks h=0 to 7.

The write address and word select offset logics 220 of DPRAM blocks generates write addresses, which addresses the storage cell of the DPRAM component 230, into which the selected data word has to be written. In the first even matrix write cycle, the write address generated by the write address and word select offset logics 220 is equal to the write counter value q=0 signaled by the common counter logic 320. This means that the selected data words are written into the storage cells k=q=0 of the DPRAM components 230 of the DPRAM blocks.

An intermediate state of the transpose memory (TRAM) 105 after the data words representing the matrix elements ye;00, ..., ye;07 have been written into the DPRAM components of the DPRAM blocks 0 to 7 is schematically illustrated in FIG. 5a taking into account the aforementioned storage cell matrix denotation schematically illustrating the data words stored in the transpose memory (TRAM) 105.

In a second even matrix write cycle of the even matrix writing stage, a second set of eight data words representing the matrix elements ye;10 to ye;17, i.e. the second row of the exemplary 8×8 input matrix Ye;, is driven by the bus combiner 300 on the concatenated data bus 301 in their original sequence order (i.e. with increasing column index). The write counter value q=1 is signaled to the DPRAM blocks 0 to 7. In detail, the data words representing the matrix elements ye;10, ..., ye;17 are selected by the word select multiplexers 210 of the DPRAM blocks 0 to 7 on the basis of the word select offset sequence sele;h(q=1)={7, 0, 1, ..., 6}, which can be obtained from the word select offset sequence sele;h(q=0)={0, 1, ..., 7} cyclically shifted right by one sequence element (q sequence elements, q=1). This means the word select multiplexer 210 of the DPRAM block h=0 selects the data word representing the matrix element ye;17, the word select multiplexer of the DPRAM block h=1 selects the data word representing the matrix element ye;10, the word select multiplexer of the DPRAM block h=2 selects the data word representing the matrix element ye;11, ..., and the word select multiplexer of the DPRAM block h=7 selects the data word representing the matrix element ye;16. This means, the word select multiplexer of the DPRAM blocks h selects the data word representing the matrix element $y^{e;1}_{sele;h}$, where the word select offset sequence sele;h(q=1)={7, 0, 1, 2, 3, 4, 5, 6} including the individual word select offsets of the DPRAM blocks h=0 to 7. An intermediate state of the transpose memory (TRAM) 105 after the data words representing the matrix elements ye;17, ye;10, ..., ye;16 have been written into the DPRAM components of the DPRAM blocks 0 to 7 is schematically illustrated in FIG. 5b.

In a third even matrix write cycle of the even matrix writing stage, a third set of eight data words representing the matrix elements ye;20 to ye;27, i.e. the second row of the exemplary 8×8 input matrix Ye;, is driven by the bus combiner 300 on the concatenated data bus 301 in their original sequence order (i.e. with increasing column index). The write counter value q=2 is signaled to the DPRAM blocks 0 to 7 and write address and word select offset logics 220 thereof generate the individual word select offsets and write addresses valid for the third even matrix write cycle associated with the write counter value q=2. The data words representing the matrix elements ye;20, ..., ye;27, are selected by the word select multiplexers 210 on the basis of the word select offset sequence sele;h(q=2)={6, 7, 0, 1, 2, 3, 4, 5}, which can be obtained from the word select offset sequence sele;h(q=0)={0, 1, 2, 3, 4, 5, 6, 7} cyclically shifted right by two sequence elements (q sequence elements, q=2). This means the word select multiplexers of the DPRAM block h selects the data word representing the matrix element $y^{e;2}_{sele;h}$, where the word select offset sequence sele;h(q=2) including the individual word select offsets of the DPRAM blocks h=0 to 7. The write address generated by the write address and word select offset logic 220 is equal to the write counter value q=2 and the selected data words are written into the memory cells k=q=2 of the DPRAM blocks. An intermediate state of the transpose memory (TRAM) 105 after the data words representing the matrix elements ye;26, ye;27, ye;20 ..., ye;25 have been written into the DPRAM components 230 of the DPRAM blocks 0 to 7 is schematically illustrated in FIG. 5c.

In a fourth even matrix write cycle of the even matrix writing stage, a fourth set of eight data words representing the matrix elements ye;30 to ye;37, i.e. the second row of the exemplary 8×8 input matrix Ye; is driven by the bus combiner 300 on the concatenated data bus 301 in the original sequence order (i.e. with increasing column index). The write counter value q=3 is signaled by the common counter logic 320 through the common write counter bus to the DPRAM blocks 0 to 7. The write address and word select offset logics 220 at each DPRAM block 0 to 7 generate the individual word select offset and write addresses valid for the fourth even matrix write cycle associated with the write counter value q=3. The data words representing the matrix elements ye;30, ..., ye;37, are selected by the word select multiplexers 210 on the basis of the individual word select offset sequence sele;h(q=3)={5, 6, 7, 0, 1, 2, 3, 4}, which can be obtained from the word select offset sequence sele;h(q=0)={0, 1, 2, 3, 4, 5, 6, 7} cyclically shifted right by three sequence elements (q sequence elements, q=3). The word select multiplexer of the DPRAM block h selects the data word representing the matrix element $y^{e;3}_{sele;h}$, wherein the word select offset sequence sele;h(q=3)={5, 6, 7, 0, 1, 2, 3, 4} including the individual word select offsets of the DPRAM blocks h=0 to 7. The write address generated by the write address and word select offset logic 220 is equal to the write counter value q=3 and the selected data words are written into the memory cells k=q=3 of the DPRAM blocks. An intermediate state of the transpose memory (TRAM) 105 the data words representing the matrix elements ye;35, ye;36, ye;37, ye;30, ..., ye;34 have been written into the DPRAM component of the DPRAM blocks 0 to 7 is schematically illustrated in FIG. 5d.

The even matrix write stages continues with the fifth write cycle (associated with the write counter value q=4), sixth write cycle (associated with the write counter value q=5) and seventh write cycle (associated with the write counter value q=6) according to the above described writing scheme, respectively.

In a (final) eight even matrix write cycle (i.e. write counter value q=7) of the even matrix writing stage, an eight set of eight data words representing the matrix elements ye;70 to ye;77, i.e. the second row of the exemplary 8×8 input matrix Ye; is driven by the bus combiner 300 on the concatenated data bus 301 in their original sequence order (i.e. with increasing column index). The write counter value q=7 is signaled to the DPRAM blocks 0 to 7 and the address and word select offset logics 220 thereof generates the individual word select offsets and write addresses valid for the eight even matrix write cycle (associated with the write counter value q=7).

The data words representing the matrix elements ye;70, ..., ye;77, are selected by the DPRAM blocks h=0 to 7 by their word select multiplexers 210 on the basis of the word select offset sequence sele;h(q=7)={1, 2, 3, 4, 5, 6, 7, 0}, which can be obtained from the word select offset sequence sele;h(q=0)={0, 1, 2, 3, 4, 5, 6, 7} cyclically shifted right by seven sequence elements (q sequence elements, q=7). This means the word select multiplexer 210 of the DPRAM block h=0 selects the data word representing the matrix element ye;71, ..., the word select multiplexer of the DPRAM block h=6 selects the data word representing the matrix element ye;77, and the word select multiplexer of the DPRAM block h=7 selects the data word representing the matrix element ye;70. The word select multiplexer of the DPRAM blocks h selects the data word representing the matrix element $y^{e;7}_{sele;h}$, where the word select offset sequence sele;h(q=7)={1, 2, 3, 4, 5, 6, 7, 0} including the individual word select offsets of the DPRAM blocks h=0 to 7. The write address generated by the write address and word select offset logic 220 is equal to the write counter value q=7 such that the selected data words are written into the memory cells k=q=7 of the DPRAM blocks. A final state of the transpose memory (TRAM) 105 after data words representing the matrix elements ye;71, ..., ye;77, ye;70 have been written is schematically illustrated in FIG. 5e.

The write addresses and the word select offsets as generated in each even matrix write cycle and by each word select offset logic 220 of each DPRAM block h=0 to 7 are summarized in the tables shown in FIG. 6. In each even matrix write cycle, the same write address is indicated to the DPRAM components such that each set of data words on the concatenated bus 301 on each clock cycle is row-wise stored in the storage matrix of the transpose memory (TRAM) 1OS. The word select offsets in each write cycle can be combined to the aforementioned word select offset sequence sele;h(q), which defines the word select offsets for the DPRAM blocks h as a function of the write counter value q. The word select offset sequence sele;h(q) starts with an original word select offset sequence sele;h(q=0)={0, 1, . . . , N−1}, which corresponds to the sequence order of the input matrix elements ye;00, . . . , ye;07 (i.e. the first row of the input matrix). The word select offset sequence of the subsequent write cycle can be generated from the original sequence order by cyclically shifting the sequence right by q sequence elements (wherein q is the write counter value signaled in the respective write cycle by the common counter logic 320 to the DPRAM blocks h).

Hence, the data words representing the matrix elements ye;ij driven on the concatenated bus 301 are stored in accordance with following writing scheme $$\text{cell}(k-h): \text{cell}(q - sel_h(q)) = y^{e;q}_{sel_h(q)},$$

where the write address k is equal to write counter value q, h is the numeral DPRAM block identifier, and sele;h(q) is the word select offset sequence as defined above and illustrated exemplarily in the table shown in FIG. 6 according to the 8×8 input matrix example.

According to a more general exemplary embodiment, N data words of the data word vector supplied to the bus combiner 300 represent the matrix elements ye;q0 to $y_{N-1}^{e;q}$ and are driven in a write cycle corresponding to the write counter value q (where q=0, 1, . . . , N−1) by the bus combiner 300 on the concatenated data bus 301. The data words may be fed into the bus combiner via N parallel data word inputs. The N data words on the concatenated data bus 301 have to be written into the transpose memory (TRAM) 105 in one clock cycle. In order to allow the transpose memory (TRAM) 1OS for storing all N data words in one clock cycle, each DPRAM block 0 to N−1 stores one data word of the N data words on the concatenated bus 301. This means that N write clock cycles are required to store all values of the even N×N input matrix Ye;. In particular, the bus combiner may concatenate and drive the data words representing the matrix elements ye;ij row-wise with increasing column index j or column-wise with increasing row index i on the concatenated data bus 301.

In accordance with the aforementioned storage cell matrix denotation k-h, the data words representing the matrix elements ye;00, . . . , $y_{N-1}^{e;0}$ are written in a first write cycle corresponding to the write counter value q=0 to the storage cells (k-h): 0-0, 0-1, . . . ,0-(N−1), wherein the write address k=q=0 and wherein the DPRAM blocks 0 to N−1 select data words from the concatenated data bus in accordance with the word select offset sequence sele;h(q=0)={0, 1, . . . , N−1}. The word select offset sequence sele;h(q=0)={0, 1, . . . , N−1} defines that the data words representing the matrix elements ye;00, . . . , $y_{N-1}^{e;0}$ are assigned in the order to the DPRAM blocks 0 to N−1, in which order the words are driven on the concatenated data bus 301.

In a second write cycle corresponding to the write counter value q=1, N data words representing the matrix elements ye;10 to $y_{N-1}^{e;1}$ are driven by the bus combiner 300 on the concatenated data bus 301 and are selected by the DPRAM blocks h=0 to N−1 by their the word select multiplexers on the basis of the word select offset sequence sele;h(q=1)={N−1, 0, 1, . . . , N−2}, which can be obtained from the word select offset sequence sele;h(q=0)={0, 1, . . . , N−1} cyclically shifted right by one sequence element (q sequence elements, q=1). The write address generated by the write address and word select offset logic 220 is equal to the write counter value q=1 such that the selected data words are written into the memory cells k=q=1 of the DPRAM blocks. This means that data words representing the matrix elements $y_{N-1}^{e;1}$, ye;10, . . . , $y_{N-2}^{e;1}$ are written to the storage cells (k-h): 1-0, . . . , 1-(N−1) in accordance with a word select offset sele;h(q=1)={N−1, 0, 1, . . . , N−2}.

In a write cycle associated with the write counter value q (where, 0≦q≦N−1), N data words representing the matrix elements ye;q0 to $y_{N-1}^{e;q}$ are driven by the bus combiner 300 on the concatenated data bus 301 and are selected by the DPRAM blocks h=0 to N−1 by their word select offset logics on the basis of the word select offset sequence sele;h(q)={N−q(mod N), N−q+1(mod N), . . . , N−q−(N−1)(mod N)}, which can be obtained from the word select offset sequence sele;h (q=0)={0, 1, . . . , N−1} cyclically shifted right by q sequence elements and the write address k=q. Hence, the data words representing the matrix elements $y_{N-q}^{e;q}$, . . . , ye;q0, . . . , $y_{N-q-1}^{e;q}$ are written to the transpose memory cells (k-h): q−0 to q−(N−1).

In a N-th even matrix write cycle associated with the write counter value q=N−1 of the even matrix writing stage N data words representing the matrix elements $y_0^{e;N-1}$ to $y_{N-1}^{e;N-1}$ are driven by the bus combiner 300 on the concatenated data bus 301 and are selected by the DPRAM blocks h=0 to N−1 by their word select multiplexers 210 on the basis of the word select sequence sele;h(q=N−1)={1, 2, . . . , N−1, 0}, which can be obtained from the word select offset sequence sele;h (q=0)={0, 1, . . . , N−1} cyclically shifted right by N−1 sequence elements (q sequence elements with q=N−1). In accordance with the aforementioned storage cell matrix denotation k-h, the data words representing the matrix elements $y_1^{e;N-1}$, . . . , $y_{N-1}^{e;N-1}$, $y_0^{e;N-1}$ are written to the transpose memory cells (N−1)-0 to (N−1)-(N−1) in accordance with a word select offset sequence sele;h(q=N−1)={1, 2, . . . , N−1, 0} and the write address k=q=N−1.

According to another exemplary embodiment of the present invention, the word select offset and the write address can be also defined as a function of the write counter value q, the numeral DPRAM identifier (ID) h and the matrix size N:

$$\text{word select offset}(q, h, N) = \begin{cases} h - q, & h \geq q \\ N + h - q, & h < q \end{cases}; \text{and}$$

$$\text{write address}(q) = q,$$

where $q, h = 0, \ldots, N-1$.

The write address and word select offset logics 220 of the DPRAM blocks may only require information about the write counter value q signaled in the actual cycle. Further, the write address and word select offset logics 220 of the DPRAM blocks may require information about the matrix to be written is an even matrix. The DPRAM (ID) identification number h is provided by the DPRAM block identification component 250 arranged with each DPRAM block 0 to 7 according to an exemplary embodiment of the invention. In typical use cases of transpose memory (TRAM), the matrix size N is predefined and constant. Hence, the matrix size N can be predefined in the write address and word select offset logics 220. Alternatively, the write address and word select offset logics 220 may be informed previous to a transpose operation about the matrix size N, which would allow for transposing any matrices having a size M≦N such that an adaptable transpose memory (TRAM) 105 can be provided according to an exemplary embodiment of the invention.

[Even Matrix Read Operation]

In the following sections, the even matrix reading stage will be described in detail. On each clock cycle a set of eight data words is read out from the storage cells of the transpose memory (TRAM) 105.

In a first cycle of the even matrix reading stage, a first set of eight data words are read out on a clock cycle. In the first cycle, a common read counter value q'=0 is signaled by the common counter logic to the DPRAM blocks 0 to 7. For the sake of simplicity, the cycle, in which the common read counter value q' is signaled, may be also designated as read cycle q' in the following. The first cycle of a matrix reading stage is for instance designated as read cycle q'=0. In the following, it will be understood more completely that in each cycle, a reading operation as well as a writing operation are carried out substantially simultaneously. Correspondingly, in each cycle, a common read counter value and a common write counter value are signaled to the DPRAM blocks.

As aforementioned, the transposition operation may be divided into a first stage of inputting/writing of the matrix elements y ;ij into the transpose memory (TRAM) 105 and a second stage of outputting/reading the transposed matrix element y ;ji from the transpose memory (TRAM) 105. This means that in the first even matrix read cycle associated with the read counter value q'=0 of the even matrix reading stage, the data words representing the matrix elements ye;00 to ye;70 should have to be outputted by the transpose memory (TRAM) 105.

The storage status of the storage cells after completion of the even matrix writing stage is illustrated in FIG. 5e already referred to above and FIG. 7a, respectively. The latter schematic illustration of FIG. 7a indicates the data words to be read out. The data words representing the matrix elements ye;00 to ye;70 are stored in the storage cells (k-h): 0-0, 1-1, 2-2, 3-3, 4-4, 5-5, 6-6, and 7-7, where h is herein the DPRAM block identification number h and k is herein the cell identification number (i.e. the cell address) of the storage cells in the respective DPRAM block h. Each of the data words representing the matrix elements ye;00 to ye;70 is stored in another DPRAM block h such that each outputs one data word in the first even matrix read cycle associated to the read counter value q'=0. However, the data words to be read out are stored in cells having different cell addresses, namely the data word representing the matrix elements ye;00 is stored in cell k=0 of the DRAM block 0, the data word representing the matrix elements ye;10 is stored in cell k=1 of the DRAM block 1, data word representing the matrix elements ye;20 is stored in cell k=2 of the DRAM block 2, . . . and the data word representing the matrix elements ye;70 is stored in cell k=7 of the DRAM block 7. With reference to the storage cell matrix (k-h) illustrated in FIG. 7a, the first set of data words to be read out are arranged in the main diagonal of the storage cell matrix (k-h).

The read address logic 240 arranged with each DPRAM block 0 to 7 generates the corresponding read address to be signaled via the read address input RA 236 to the DPRAM component 230 during reading out of the data word. The read address logics 240 of the DPRAM blocks 0 to 7 are coupled via a common read counter bus to the common counter logic 320 of the transpose memory (TRAM) 105. The common counter logic 320 supplies a common read counter to the read address logics 240, which generate the respective individual read address on the basis of the common read counter. In analogy to the above defined word select offset sequence sele;h(q'), a read address sequence rde;h(q') can be defined, which includes the individual read addresses of the DPRAM blocks h=0 to 7. In the first even matrix read cycle corresponding to the read counter value q'=0, the read address sequence rde;h(q')={0, 1, 2, 3, 4, 5, 6, 7}.

An output vector ve; (q) formed of the read out data words results in the first read cycle corresponding to the read counter value q=0 to ve; (q=0)=(ye;00, ye;10, $y_0^{e;N-1}$). With reference to the following description, it will be understood that a sequence order of the vector elements ve;h in the DPRAM block output vector ve; (q'=0) will have to be considered. Correspondingly, the vector element order orde;jh(q') should be defined, which results in the first read cycle corresponding to the read counter value q=0 to is orde;jh(q'=0)={0, 1, 2, 3, 4, 5, 6, 7}, where h=0, . . . , 7. Hence, the data words read out on the first even matrix clock cycle q'=0 may be for instance directly outputted to the fully parallel one dimensional transform block 110.

In a second even matrix read cycle associated with the read counter value q'=1, a second set of eight data words are read out on a clock cycle. In accordance with the transpose operation, the data words representing the matrix elements ye;01 to ye;71 should have to be outputted by the transpose memory (TRAM) 105.

The data words representing the matrix elements ye;01 to ye;71 are stored in the storage cells (k-h): 0-1, 1-2, 2-3, 3-4, 4-5, 5-6, 6-7, and 7-0, where h is the DPRAM block identification number h and k is the cell identification number of the storage cells in the respective DPRAM block h. The corresponding storage cell matrix is schematically illustrated in FIG. 7b. Again, each of the data words representing the matrix elements ye;01 to ye;71 is stored in another DPRAM block h such that each outputs one data word in the first even matrix read cycle corresponding to the read counter value q'=1. However, the data words to be read out are stored in cells having different addresses, namely the data word representing the matrix elements ye;71 is stored in cell k=7 of the DRAM block 0, the data word representing the matrix elements ye;01 is stored in cell k=0 of the DRAM block 1, data word representing the matrix elements ye;11 is stored in cell k=1 of the DRAM block 2, . . . and the data word representing the matrix elements ye;61 is stored in cell k=6 of the DRAM block 7. The read address logic 240 arranged with each DPRAM block 0 to 7 generates on the basis of the read counter value q' signaled by the common counter logic the corresponding read address. The read address sequence defined above is given for the second even matrix read cycle as rde;h(q'=1)={7, 0, 1, 2, 3, 4, 5, 6}. The read address sequence rde;h (q'=1) for second even matrix read cycle q'=1 can be obtained from the read address sequence rde;h(q'=0)={0, 1, 2, 3, 4, 5, 6, 7} cyclically shifted right by one sequence elements (i.e. q' elements, the read counter value q'=1).

As aforementioned, the 8 data words read out from the DPRAM blocks form an 8-word data vector. According to first even matrix read cycle associated with the read counter value q'=0, the word data vector has been formed starting with its first vector element read out from the DPRAM block h=0 and ending with its last vector element from the DPRAM block h=7. When now applying this scheme to form the output word data vector, the word data vector outputted by the DPRAM blocks 0 to 7 in this second even matrix read cycle associated with the read counter value q'=1 includes eight data words in the following sequence of data words representing the matrix elements ve; (q'=1)=(ye;71, ye;01, ye;11, . . . , ye;61). Hence, the corresponding vector element order orde;jh(q') is orde;jh(q'=1)={7, 0, 1, 2, 3, 4, 5, 6}.

Those skilled in the art will appreciate that the DPRAM block output vector ve; (q'=1) does not show the desired sequence order. The "misaligned" DPRAM block output vector is fed into the word reorderer 310, which rearranges the data words of the vector into the required vector element order. The operation of the word reorderer 310 will be described in more detail below.

In a third even matrix read cycle associated with the read counter value q'=2, a third set of eight data words are read out on a clock cycle. In accordance with the transpose operation, the data words representing the matrix elements ye;02 to ye;72 should have to be outputted by the transpose memory (TRAM) 105.

The data words representing the matrix elements ye;02 to ye;72 are stored in the storage cells (k-h): 0-2, 1-3, 2-4, 3-5, 4-6, 5-7, 6-0, and 7-1, where h is the DPRAM block identification number h and k is the cell identification number of the storage cells in the respective DPRAM block h. The corresponding storage cell matrix is illustrated schematically in FIG. 7c. Again, each of the data words representing the matrix elements ye;02 to ye;72 is stored in another DPRAM block h such that each outputs one data word in the third even matrix read cycle. The data words to be read out are stored in cells having different addresses, namely the data word representing the matrix elements ye;62 is stored in cell k=6 of the DRAM block 0, the data word representing the matrix elements ye;72 is stored in cell k=7 of the DRAM block 1, the data word representing the matrix elements ye;02 is stored in cell k=0 of the DRAM block 2, data word representing the matrix elements ye;12 is stored in cell k=1 of the DRAM block 3, . . . and the data word representing the matrix elements ye;52 is stored in cell k=5 of the DRAM block 7. The read address logic 240 arranged with each DPRAM block 0 to 7 generates on the basis of the read counter value q' signaled by the common counter logic the corresponding read address. The read address sequence for the third even matrix read cycle associated with the read counter value q'=2 is rde;h(q'=2)={6, 7, 0, 1, 2, 3, 4, 5}, which can be obtained from the read address sequence rde;h(q'=0)={0, 1, 2, 3, 4, 5, 6, 7} cyclically shifted right by two sequence elements (i.e. q' elements, q'=2). The word data vector outputted in this second even matrix read cycle associated with the read counter value q'=2 by the DPRAM blocks 0 to 7 includes eight data words in the following sequence of data words representing the matrix elements ve; (q'=2)=(ye;62, ye;72, ye;02, ye;12, . . . , ye;52) and the corresponding vector element order orde;jh(q') is orde;jh (q')={6, 7, 0, 1, 2, 3, 4, 5}.

In a fourth even matrix read cycle associated with the read counter value q'=3, a fourth set of eight data words are read out on a clock cycle. In accordance with the transpose operation, the data words representing the matrix elements ye;03 to ye;73 should have to be outputted by the transpose memory (TRAM) 105.

The data words representing the matrix elements ye;03 to ye;73 are stored in the storage cells (k-h): 0-3, 1-4, 2-5, 3-6, 4-7, 5-0, 6-1, and 7-2, where h is the DPRAM block identification number h and k is the cell identification number of the storage cells in the respective DPRAM block h. The corresponding storage cell matrix is illustrated schematically in FIG. 7d. Again, each of the data words representing the matrix elements ye;03 to ye;73 is stored in another DPRAM block h such that each outputs one data word in the fourth even matrix read cycle associated with the read counter value q'=3 and the data words to be read out are stored in different cells. The read address logic 240 arranged with each DPRAM block 0 to 7 generates on the basis of the read counter value q' signaled by the common counter logic the corresponding read address. The read address sequence rde;h(q') for the fourth even matrix read cycle is rde;h(q'=3)={5, 6, 7, 0, 1, 2, 3, 4}, which can be obtained from the read address sequence rde;h (q'=0)={0, 1, 2, 3, 4, 5, 6, 7} cyclically shifted right by three sequence elements (i.e. q' elements, associated with the read counter value q'=3). The word data vector outputted in this fourth even matrix read cycle associated with the read counter value q'=3 by the DPRAM blocks 0 to 7 includes eight data words in the following sequence of data words representing the matrix elements ve; (q'=3)=(ye;53, ye;63, ye;73, ye;03, ye;13, . . . , ye;53) and the corresponding vector element order orde;jh (q') is orde;jh(q')={5, 6, 7, 0, 1, 2, 3, 4}.

The even matrix read stages continues with the fifth read cycle (read counter value q'=4), sixth read cycle (read counter value q'=5) and seventh read cycle (read counter value q'=6) according to the above described writing scheme, respectively.

In a (final) eight read cycle of the even matrix reading stage (indicated by the read counter value q'=7), an eight set of eight data words are read out on a clock cycle. In accordance with the transpose operation, the data words representing the matrix elements ye;07 to ye;77 should have to be outputted by the transpose memory (TRAM) 105.

The data words representing the matrix elements ye;07 to ye;77 are stored in the storage cells (k-h): 0-7, 1-0, 2-1, 3-2, 4-3, 5-4, 6-5, and 7-6, where h is the DPRAM block identification number h and k is the cell identification number of the storage cells in the respective DPRAM block h. The corresponding storage cell matrix is illustrated schematically in FIG. 7e. Again, each of the data words representing the matrix elements ye;07 to ye;77 is stored in another DPRAM block h such that each outputs one data word in the eight even matrix read cycle and the data words to be read out are stored in different cells. The read address logic 240 arranged with each DPRAM block 0 to 7 generates on the basis of the read counter value q' the corresponding read address. The read address sequence rde;h(q') for the third even matrix read cycle q'=7 is rde;h(q'=7)={1, 2, 3, 4, 5, 6, 7, 0}, which can be obtained from the read address sequence rde;h(q'=0)={0, 1, 2, 3, 4, 5, 6, 7} cyclically shifted right by seven sequence elements (i.e. q' elements, read counter value q'=7). The word data vector outputted in this eight even matrix read cycle (indicated by the read counter value q'=7) by the DPRAM blocks 0 to 7 includes eight data words in the following sequence of data words representing the matrix elements ve; (q'=7)=(ye; 17, . . . , ye;77, ye;07) and the corresponding vector element order orde;jh(q') is orde;jh(q'=7)={1, 2, 3, 4, 5, 6, 7, 0}.

The read addresses as generated in each even matrix read cycle and by each read address logic 240 of each DPRAM block h=0 to 7 are summarized in the tables shown in FIG. 8. In each even matrix read cycle corresponding to read counter value q, the read address is indicated to the DPRAM component such that each DPRAM block output a data word on each clock cycle. The read addresses in each read cycle can be combined to the aforementioned read address sequence rde; h(q'), which defines the read addresses for the DPRAM blocks h as a function of the read counter value q' signaled by the common counter logic. The read address sequence rde;h (q) starts with an original read address sequence rde;h(q=0)={0, 1, . . . , 7}, which corresponds to the sequence order of the transposed input matrix elements ye;00, . . . , ye;70 (i.e. the first column of the input matrix). The read address sequence of the subsequent read cycle corresponding to the read counter value q' can be generated from the original sequence order by cyclically shifting the original sequence right by q' sequence elements.

Hence, the data words representing the matrix elements ye;ij are outputted in accordance with following reading scheme $$\text{cell}(k-h):\ \text{cell}(rde;h(q')-h) = y_h^{e;rde;h(q')}$$

where each DPRAM block h outputs a data word and the read address k of the respective DPRAM block h is defined on the basis of the read address sequence rde;h(q') as defined above and illustrated exemplarily in the table shown in FIG. 8 according to the 8×8 input matrix example.

According to a more general exemplary embodiment of the present invention, N data words are read out from the N DPRAM blocks 0 to N−1. In a first read cycle (indicated by the read counter value q'=0), the data words representing the matrix elements ye;00 to $y_0^{e;N-1}$ are stored in the storage cells (k-h): 0-0, . . . , (N−1)-(N−1), where h is the DPRAM block identification number h and k is the cell identification number of the storage cells in the respective DPRAM block h. Each of the data words representing the matrix elements ye;00 to $y_0^{e;N-1}$ is stored in another DPRAM block h such that each DPRAM block h outputs one data word in the first even matrix read cycle. A read address sequence rde;h(q') can be defined, which includes the individual read addresses of the DPRAM blocks h=0 to N−1. In the first even matrix read cycle, the read address sequence rde;h(q')={0, 1, . . . , N−1}, where q' is the read counter value.

The N data words read out from the DPRAM components form an N-word data vector, which includes the data words representing the matrix elements ye;00 to $y_0^{e;N-1}$ with increasing row index. The first vector element ve;0(q'=0) is provided by DPRAM block h=0, the second vector element ve;1(q'=0) is provided by DPRAM block h=1, . . . , the N−1 vector element ve;N−1 (q'=0) is provided by DPRAM block h=N−1. This means, the vector ve; (q) is ve; (q=0)=(ye;00, ye;10, . . . , $y_0^{e;N-1}$). A DPRAM block output vector element order orde;jh(q') may be defined, which includes the individual row indexes of the vector elements with reference to the DPRAM block identifier h, where the DPRAM block output vector is formed on the basis of data words starting with the data word read out from DPRAM block h=0 and ending with the data word read out from DPRAM block h=N−1. Herein, the vector element order orde;jh(q'=0)= {0, 1, . . . , N−1}, where h=0, . . . , N−1.

In a read cycle corresponding to the read counter value q', the data words representing the matrix elements ye;0q' to $y_{q'}^{e;N-1}$ are stored in the storage cells (k-h): 0-q', 1-(q'+1), . . . , (N−q'−1)-(N−1), (N−q')-0, . . . , (N−1)-(q'−1), where h is the DPRAM block identification number h and k is the cell identification number of the storage cells in the respective DPRAM block h.

The read address sequence rde;h(q') for the even matrix read cycle is rde;h(q')={N−q'(mod N), N−q'+1(mod N), . . . , N−q'+(N−1)(mod N)}, which can be obtained from the read address sequence rde;h(q'=0)={0, 1, . . . , N−1} by cyclically shifting right by q' sequence elements. The DPRAM block output vector ve; (q') formed in accordance with the aforementioned scheme results to ve;(q')=($y_{q'}^{e;N-q'(mod\ N)}$, $y_{q'}^{e;N-q'+1(mod\ N)}$, . . . , $y_{q'}^{e;N-q'+(N-1)(mod\ N)}$) and the corresponding vector element order orde;jh(q')={N−q'(mod N), N−q'+1(mod N), . . . , N−q'+(N−1)(mod N)}.

According to another exemplary embodiment of the present invention, the read address can be also defined as a function of the read counter value q' signaled by the common counter logic, the numeral DPRAM identifier (ID) h and the matrix size N:

$$\text{read address}(q, h, N) = \begin{cases} h - q', & h \geq q' \\ N + h - q', & h < q' \end{cases}$$

where $$q', h = 0, \ldots, N-1.$$

The read address logics 240 of the DPRAM blocks 0 to 7 may only require information about the read counter value q' signaled in the actual cycle. Further, the read address logics 240 may require information about the matrix to be read is an even matrix. The DPRAM (ID) identification number h is provided by the DPRAM block identification component 250 arranged with each DPRAM block according to an exemplary embodiment of the invention. In typical use cases of transpose memory (TRAM), the matrix size N is predefined and constant. Hence, the matrix size N can be predefined in the read address logics 240. Alternatively, the read address logics 240 may be informed previous to a transpose operation about the matrix size N, which would allow for transposing any matrices having a size M≦N such that an adaptable transpose memory (TRAM) 105 can be provided according to an exemplary embodiment of the invention.

[Reordering Operation]

Figure 9A:
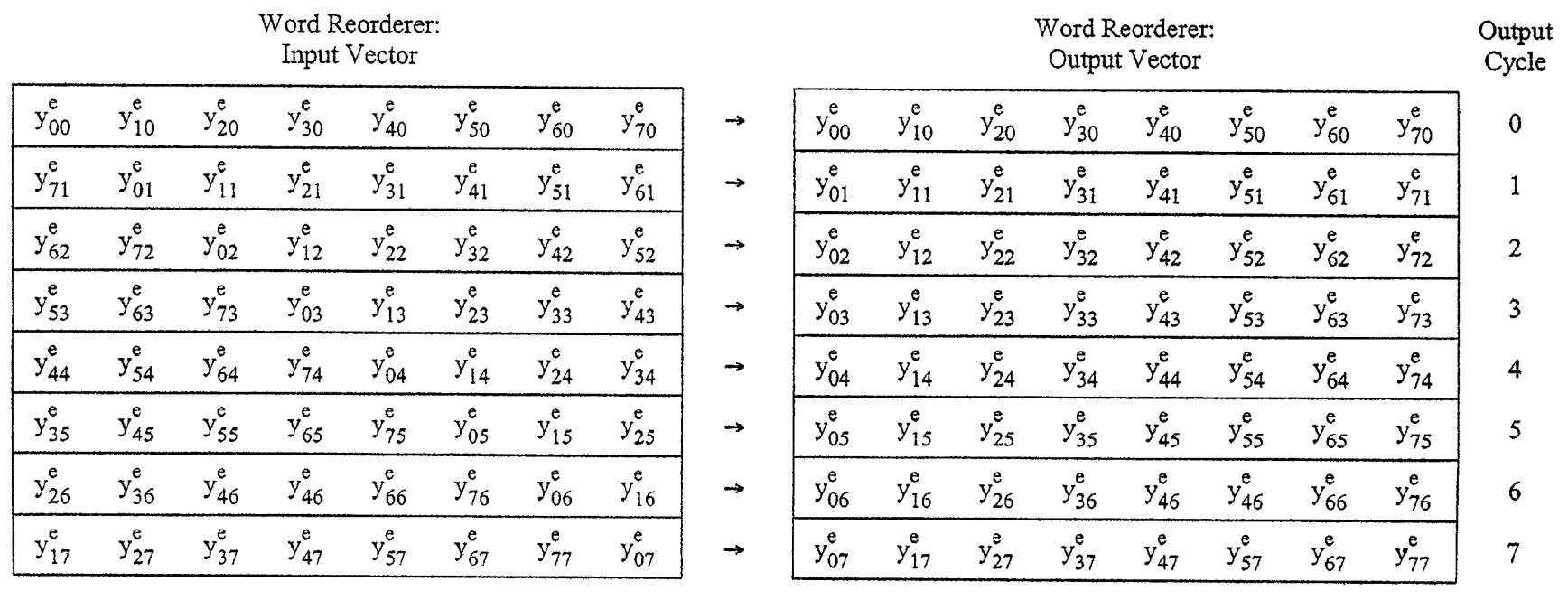

However, the DPRAM block output vectors ve; (q') (read cycle q'=0, . . . , N−1) have not the required element sequence. In FIG. 9a, the sequence order of the vector elements on input side of the word reorderer 310 is illustrated. As described above, the DPRAM block output vector ve; (q'=0) (which is the input vector to the word reorderer) has the vector element order orde;jh (q'=0)={0, 1, 2, 3, 4, 5, 6, 7}, which corresponds to the desired element sequence. Hence, reordering is not necessary and the transpose memory (TRAM) word data output vector Vout; (q'=0) of the transpose memory (TRAM) 105 corresponds to the DPRAM block output vectors ve; (q'=0). The DPRAM block output vectors ve; (q'), where q'>0, do not show the desired vector element order. For instance, vector element order orde;jh(q'=1)={7, 0, 1, 2, 3, 4, 5, 6}, vector element order orde;jh(q'=2)={6, 7, 0, 1, 2, 3, 4, 5}, . . . , vector element order orde;jh (q'=6)={2, 3, 4, 5, 6, 7, 0, 1} and vector element order orde;jh(q'=7)={1, 2, 3, 4, 5, 6, 7, 0}.

The reordering scheme required to reorder the DPRAM block output vectors ve; (q'), q'=0, . . . , N−1, into the transpose memory (TRAM) output vector Vout; (q') is illustratively depicted in the table shown in FIG. 9b. The reordering may be implemented on the basis of element assignment scheme as a function of the read cycle q' in accordance with which element assignment scheme a vector element i of the word reorderer input vector (corresponding to the DPRAM block output vectors ve; (q')) is assigned to a vector element j of the word reorderer output vector (corresponding to transpose memory (TRAM) output vector Vout; (q'). Alternatively, the vector elements i of the word reorderer input vector can be cyclically shifted left by q' elements in order to obtain the desired word reorderer output vector.

[Odd Matrix Transpose Operation]

The transpose operation of an "even" input matrix including writing the input matrix into the transpose memory (TRAM) and outputting a transposed even input matrix from the transpose memory (TRAM) has been described in detail above. In the following description, the transpose operation of an "odd" input matrix Yo; will be described. Those skilled in the art will understand from the following description, that the transpose operation of the subsequent odd input matrix Yo; seamlessly follows the reading of the elements of the even input matrix Ye;. Again, the transpose operation is divided into a first stage of inputting/writing of the matrix elements yo;ij into the transpose memory (TRAM) 105 and a second stage of outputting/reading the transposed matrix element yo;ji from the transpose memory (TRAM) 105. In FIG. 10a, the storage status of the storage cells during reading in the even matrix read cycle q'=1 is illustrated. This represents the initial state of the storage cells of the transpose memory (TRAM) at which the write operation of the odd input matrix Yo; begins. In the even matrix read cycle q'=1, the set of data words stored in the storage cells (k-h): 0-1, 1-2, 2-3, 3-4, 4-5, 5-6, 6-7, and 7-0 are read out. The storage cells (k-h): 0-0, 1-1, 2-2, 3-3, 4-4, 5-5, 6-6, and 7-7 have been read out in the previous in the even matrix read cycle q'=0. The data words read out in the previous even matrix read cycle q'=0 are not required any more. Hence, the storage cells (k-h): 0-0, 1-1, 2-2, 3-3, 4-4, 5-5, 6-6, and 7-7 are free and new data words can be stored therein.

The possibility to store new data words into the transpose storage cells, which have been read out, is used to write data words of the subsequent "odd" input matrix therein. The writing of the data words of the subsequent "odd" input matrix Yo; begins immediately after completion of the first even matrix read cycle q'=0.

[Odd Matrix Write Operation]

In a first odd matrix write cycle of the even matrix writing stage, a first set of eight data words representing the matrix elements yo;00 to yo;07, i.e. the first row of the exemplary 8×8 input matrix Yo;, is driven by the bus combiner 300 on the concatenated data bus 301 in their original sequence order (i.e. with increasing column index). The common write counter value q, which is reset to q=0 at the start of the writing stage, is signaled by the common counter logic 320 through the common write counter bus to the DPRAM blocks 0 to 7. The write address and word select offset logics 220 provided with respective DPRAM blocks 0 to 7 generate individual word select offsets and write addresses on the basis of the write counter value q. An individual word select offset enables the word select multiplexer 210 provided with each DPRAM block 0 to 7 to select one specific data word out of the eight concatenated data words on the 8-word wide concatenated bus 301. The data words representing the matrix elements yo;00, ..., yo;07 are selected by the DPRAM blocks h=0 to 7 in accordance with their original sequence order. This means the word select multiplexer of the DPRAM block h=0 selects the data word representing the matrix elements yo;00, the word select multiplexer of the DPRAM block h=1 selects the data word representing the matrix elements yo;01, ..., and the word select multiplexer of the DPRAM block h=7 selects the data word representing the matrix elements yo;07. The word select multiplexer of the DPRAM block h selects the data word representing the matrix elements yo;0h. In accordance with the aforementioned word select offset scheme, a word select offset sequence selo;h(q=0)={0, 1, 2, 3, 4, 5, 6, 7} can be defined, which includes the individual word select offsets of the DPRAM blocks h=0 to 7.

The write address and word select offset logics 220 of DPRAM blocks generates write addresses, which addresses the storage cell of the DPRAM component 230, into which the selected data word has to be written. In contrast to the even matrix write address being equal to the common write counter value q, the selected data words have to be written into the free storage cells of the transpose memory (TRAM). Hence, the individual write addresses of the DPRAM blocks correspond to the read addresses, which have been defined in accordance with the even matrix read cycles. Again, a write address sequence wro;h(q) should be defined, which includes the write addresses of the DPRAM blocks 0 to 7. In the first odd matrix write cycle associated with write counter value q=0, the write address sequence wro;h(q)={0, 1, 2, 3, 4, 5, 6, 7}.

This means that yo;0h is written into the cell($k - h$): cell($wro$; $h(q = 0) - h$) = $yo$;

$0selo$; $h(q = 0)$, where $h = 0, \ldots, 7$.

An intermediate state of the transpose memory (TRAM) 105 after the data words representing the matrix elements yo;00, ..., yo;07 have been written into the transpose memory (TRAM) is schematically illustrated in FIG. 10b.

In a second odd matrix write cycle corresponding to the write counter value q=1 of the odd matrix writing stage, a second set of eight data words representing the matrix elements yo;10 to yo;17, i.e. the first row of the exemplary 8×8 input matrix Yo;, is driven by the bus combiner 300 on the concatenated data bus 301 in their original sequence order (i.e. with increasing column index). In the following description, the word selection and write addressing will be described on the basis of the word select offset sequence and write address sequence, which has been defined above and which interpretation has been described in detail with reference to the transpose operation of the even input matrix. The word select offset sequence selo;h(q) is selo;h (q=1)={7, 0, 1, 2, 3, 4, 5, 6} including the individual word select offsets of the DPRAM blocks h=0 to 7. The write address sequence wro;h (q) is wro;h(q=1)={7, 0, 1, 2, 3, 4, 5, 6} including the write addresses of the DPRAM blocks h=0 to 7. The word select offset sequence selo;h (q=1) can be obtained from the word select offset sequence selo;h(q=0)={0, 1, 2, 3, 4, 5, 6, 7} by cyclically shifting right by one sequence element (q elements, q=1). Likewise, the write address sequence wro;h(q=1) can be obtained from the read address sequence wro;h(q=0)={0, 1, 2, 3, 4, 5, 6, 7} by cyclically shifting right by one sequence element (q elements, write counter value q=1).

An intermediate state of the transpose memory (TRAM) 105 after the data words representing the matrix elements yo;10, ..., yo;17 have been written into the transpose memory (TRAM) is schematically illustrated in FIG. 10c.

This means that yo;1h is written into the cell($k - h$): cell($wro$; $h(q = 1) - h$) = $yo$;

$1selo$; $h(q = 1)$, where $h = 0, \ldots, 7$.

In a third odd matrix write cycle corresponding to write counter value q=2 of the odd matrix writing stage, a third set of eight data words representing the matrix elements yo;20 to yo;27, i.e. the first row of the exemplary 8×8 input matrix Yo;, is driven by the bus combiner 300 on the concatenated data bus 301 in their original sequence order (i.e. with increasing column index). The word select offset sequence selo;h(q) is selo;h(q=2)={6, 7, 0, 1, 2, 3, 4, 5} including the individual word select offsets of the DPRAM blocks h=0 to 7. The write address sequence wro;h is wro;h(q=2)={6, 7, 0, 1, 2, 3, 4, 5} including the write addresses of the DPRAM blocks h=0 to 7. The word select offset sequence selo;h(q=2) can be obtained from the word select offset sequence selo;h(q=0)={0, 1, 2, 3, 4, 5, 6, 7} by cyclically shifting right by two sequence elements (q elements, q=2). Likewise, the write address sequence wro;h(q=2) can be obtained from the read address sequence wro;h(q=0)={0, 1, 2, 3, 4, 5, 6, 7} by cyclically shifting right by two sequence elements (q elements, q=2).

An intermediate state of the transpose memory (TRAM) 105 after the data words representing the matrix elements yo;20 to yo;27 have been written into the transpose memory (TRAM) is schematically illustrated in FIG. 10d.

This means that yo;2h is written into the $$\text{cell}(k-h)\text{: cell}(wro; h(q=2)-h) = yo;$$

$$2selo; h(q=2), \text{ where } h = 0, \ldots, 7.$$

In a fourth odd matrix write cycle corresponding to write counter value q=3 of the odd matrix writing stage, a fourth set of eight data words representing the matrix elements yo;30 to yo;37, i.e. the first row of the exemplary 8×8 input matrix Yo;, is driven by the bus combiner 300 on the concatenated data bus 301 in their original sequence order (i.e. with increasing column index). The word select offset sequence selo;h(q) is selo;h(q=3)={5, 6, 7, 0, 1, 2, 3, 4} including the individual word select offsets of the DPRAM blocks h=0 to 7. The write address sequence wro;h(q) is wro;h(q=3)={6, 7, 0, 1, 2, 3, 4, 5} including the writer addresses of the DPRAM blocks h=0 to 7. The word select offset sequence selo;h(q=3) can be obtained from the word select offset sequence selo;h(q=0)={0, 1, 2, 3, 4, 5, 6, 7} by cyclically shifting right by thee sequence elements (q elements, q=3). Likewise, the write address sequence wro;h(q=3) can be obtained from the read address sequence wro;h(q=0)={0, 1, 2, 3, 4, 5, 6, 7} by cyclically shifting right by three sequence elements (q elements, q=3).

An intermediate state of the transpose memory (TRAM) 105 after the data words representing the matrix elements yo;30 to yo;37 have been written into the transpose memory (TRAM) is schematically illustrated in FIG. 10e.

This means that yo;3h is written into the $$\text{cell}(k-h)\text{: cell}(wro; h(q=3)-h) = yo;$$

$$3selo; h(q=3), \text{ where } h = 0, \ldots, 7.$$

In an eight odd matrix write cycle corresponding to the write counter value q=7 of the odd matrix writing stage, an eight set of eight data words representing the matrix elements yo;70 to yo;77, i.e. the first row of the exemplary 8×8 input matrix Yo;, is driven by the bus combiner 300 on the concatenated data bus 301 in their original sequence order (i.e. with increasing column index). The word select offset sequence selo;h(q) is selo;h(q=7)={1, 2, 3, 4, 5, 6, 7, 0} including the individual word select offsets of the DPRAM blocks h=0 to 7. The write address sequence wro;h(q) is wro;h(q=7)={1, 2, 3, 4, 5, 6, 7, 0} including the writer addresses of the DPRAM blocks h=0 to 7. The word select offset sequence selo;h(q=7) can be obtained from the word select offset sequence selo;h(q=0)={0, 1, 2, 3, 4, 5, 6, 7} by cyclically shifting right by thee sequence elements (q elements, q=7). Likewise, the write address sequence wro;h(q=7) can be obtained from the read address sequence wro;h(q=0)={0, 1, 2, 3, 4, 5, 6, 7} by cyclically shifting right by three sequence elements (q elements, q=7).

An intermediate state of the transpose memory (TRAM) 105 after the data words representing the matrix elements yo;70 to yo;77 have been written into the transpose memory (TRAM) is schematically illustrated in FIG. 10f.

This means that yo;7h is written into the $$\text{cell}(k-h)\text{: cell}(wro; h(q=7)-h) = yo;$$

$$7selo; h(q=7), \text{ where } h = 0, \ldots, 7.$$

The write addresses and the word select offsets as generated in each odd matrix write cycle and by each write address and word select offset logic 220 of each DPRAM block h=0 to 7 are summarized in the tables shown in FIG. 11.

According to a more general exemplary embodiment, the aforementioned write rules may be generalized for N data words of the data word vector supplied to the bus combiner 300.

In a first odd matrix write cycle corresponding to write counter value q=0, the N data words of the data word vector represent the matrix elements yo;00 to $y_{N-1}^{o;0}$ and are driven by the bus combiner 300 on the concatenated data bus 301. The data words may be fed into the bus combiner via N parallel data word inputs. The N data words on the concatenated data bus 301 have to be written into the transpose memory (TRAM) 105 in one clock cycle. In order to allow the transpose memory (TRAM) 105 for storing all N data words in one clock cycle, each DPRAM block 0 to N−1 stores one data word of the N data words on the concatenated bus 301. This means that N write clock cycles are required to store all values of the even N×N input matrix Yo;. The bus combiner concatenates and drives the data words representing the matrix elements yo;ij row-wise with increasing column index j on the concatenated data bus 301. More generally, the bus combiner drives on an even matrix write cycle the data words representing the matrix elements yo;q0, yo;q1, . . . , $y_{N-1}^{o;q}$, where q designates the common write counter value q with q=0, 1, . . . , N−1 corresponding to N even matrix write cycles in total. The word select offset sequence selo;h(q=0)= {0, 1, . . . , N−1} is defined, which includes the individual word select offsets of the DPRAM blocks h=0 to N−1. This means that data words representing the matrix elements yo;00, . . . , $y_{N-1}^{o;0}$ are assigned to the DPRAM blocks 1 to N−1 in the order, in which the data words are driven on the concatenated data bus 301.

The write address sequence wro;h(q) is defined, which includes the writer addresses of the DPRAM blocks 0 to N−1. In the first odd matrix write cycle corresponding to write counter value q=0, the write address sequence wro;h(q)={0, 1, . . . , N−1}. In accordance with the aforementioned storage cell matrix denotation k-h, the data words representing the matrix elements yo;00, . . . , $y_{N-1}^{o;0}$ are written to the storage cells (k-h): 0-0, 1-1, . . . , (N−1)-(N−1), wherein the write address k is given on the basis of the write address sequence wro;h(q=0)={0, 1, . . . , N−1} and the DPRAM blocks 0 to N−1 select data words from the concatenated data bus in accordance with the word select offset sequence selo;h(q=0)={0, 1, . . . , N−1}.

In an odd matrix write cycle corresponding to write counter value q, the N data words of the data word vector supplied to the bus combiner 300 represent the matrix elements $y_0^{o;q}$ to $y_{N-1}^{o;q}$. The word select offset sequence selo;h(q) is selo;h (q)={N−q(mod N), N−q+1(mod N), . . . , N−q+(N−1)(mod N)} including the individual word select offsets of the DPRAM blocks h=0 to N−1. The write address sequence wro;h(q) is wro;h(q)={N−q(mod N), N−q+1(mod N), ... , N−q+(N−1)(mod N)} including the writer addresses of the DPRAM blocks 0 to N−1. The word select offset sequence selo;h(q) can be obtained from the word select offset sequence selo;h(q=0)={0, ... , N−1} by cyclically shifting right by q sequence elements. Likewise, the write address sequence wro;h(q) can be obtained from the read address sequence wro;h(q=0)={0, ... , N−1} by cyclically shifting right by q sequence elements.

This means that $y_h^{o;q}$ is written into the $$\text{cell}(k-h): \text{cell}(wro; h(q)-h) = yo; qselo;$$

$$h(q), \text{ where } h = 0, \ldots, N-1, \text{ respectively.}$$

Both, the write address sequence wro;h(q) and the word select offset sequence selo;h(q) start with an initial sequence wro;h(q)=selo;h(q=0)={0, 1, ... , N−1}. The write address and the word select offset sequences of a subsequent write cycle can be generated from the initial sequences by cyclically shifting right by q sequence elements, where q is the common write counter value associated with the write cycle.

The select offset sequence selo;h(q) and the write address sequence wro;h(q) as defined above is exemplarily illustrated in the table shown in FIG. 11 according to the 8×8 input matrix example.

According to another exemplary embodiment of the present invention, the word select offset and the write address can be also defined as a function of the write counter value q signaled by the common counter logic, the numeral DPRAM identifier (ID) h and the matrix size N:

$$\text{word select offset}(q, h, N) = \begin{cases} h-q, & h \geq q \\ N+h-q, & h < q \end{cases}; \text{ and}$$

$$\text{write address}(q, h, N) = \begin{cases} h-q, & h \geq q \\ N+h-q, & h < q \end{cases},$$

$$\text{where } q, h = 0, \ldots, N-1.$$

The write address and word select offset logics 220 of the DPRAM blocks may only require information about the write counter value q signaled in the actual cycle. Further, the write address and word select offset logics 220 of the DPRAM blocks may require information about the matrix to be written is an odd matrix. The DPRAM (ID) identification number h is provided by the DPRAM block identification component 250 arranged with each DPRAM block 0 to 7 according to an exemplary embodiment of the invention. In typical use cases of transpose memory (TRAM), the matrix size N is pre-defined and constant. Hence, the matrix size N can be pre-defined in the write address and word select offset logics 220. Alternatively, the write address and word select offset logics 220 may be informed previous to a transpose operation about the matrix size N, which would allow for transposing any matrices having a size M≦N such that an adaptable transpose memory (TRAM) 105 can be provided according to an exemplary embodiment of the invention.

Those skilled in the art will understand on the basis of the description above that the odd input matrix write stage is interleaved with the even input matrix read stage. The odd input matrix write stage starts with an offset of one cycle with respect to the start of the even input matrix read stage. Due to the use of dual port memory (DPRAM), the read and write operations can be performed on the same clock cycle but the write operation of the next matrix to be transposed is offset by one clock cycle in relation to the read operation of the matrix written into the transpose memory (TRAM).

[Odd Matrix Read Operation]

In the following sections, the odd matrix reading stage will be described in detail. On each clock cycle a set of eight data words is read out from the storage cells of the transpose memory (TRAM) 105.

In a first read cycle of the odd matrix reading stage, a first set of eight data words are read out on a clock cycle. Correspondingly, a read counter value q'=0 is signaled by the common counter logic. As aforementioned, the transposition operation may be divided into a first stage of inputting/writing of the matrix elements y ;ij into the transpose memory (TRAM) 105 and a second stage of outputting/reading the transposed matrix element y ;ji from the transpose memory (TRAM) 105. This means that in the first read cycle of the odd matrix reading stage, the data words representing the matrix elements yo;00 to yo;70 should have to be outputted by the transpose memory (TRAM) 105.

The storage status of the storage cells after completion of the odd matrix writing stage is illustrated in FIG. 10f already referred to above and FIG. 12, respectively. The data words representing the matrix elements yo;00 to yo;70 are stored in the storage cells (k-h): 0-0, 0-1, 0-2, 0-3, 0-4, 0-5, 0-6, and 0-7, where h is the DPRAM block identification number h and k is the cell identification number (i.e. the cell address) of the storage cells in the respective DPRAM block h. Each of the data words representing the matrix elements yo;00 to yo;70 is stored in another DPRAM block h such that each outputs one data word in the first odd matrix read cycle indicated by the read counter value q'=0. Moreover, the data words to be read out are stored in cells having the same cell address, namely the data word representing the matrix elements yo;00 is stored in cell k=0 of the DRAM block 0, the data word representing the matrix elements yo;10 is stored in cell k=0 of the DRAM block 1, data word representing the matrix elements yo;20 is stored in cell k=0 of the DRAM block 2, ... and the data word representing the matrix elements yo;70 is stored in cell k=0 of the DRAM block 7.

The read address logic 240 arranged with each DPRAM block 0 to 7 generates the corresponding read address to be signaled via the read address input RA 236 to the DPRAM component 230 during reading out of the data word. The read address logics 240 of the DPRAM blocks 0 to 7 are coupled via a common read counter bus to the common counter logic 320 of the transpose memory (TRAM) 105. The common counter logic 320 supplies a common read counter value q' to the read address logics 240, which generate the respective individual read address on the basis of the common read counter. The read addresses generated at the DPRAM blocks 0 to 7 is equal to the read counter value q'.

According to the 8×8 input matrix example, the vector outputted by the DPRAM blocks is vo; (q) is vo; (q'=0)=(yo; 00, yo;10, ... , yo;70). Correspondingly, the vector element order ordo;jh (q') is ordo;jh(q'=0)={0, 1, 2, 3, 4, 5, 6, 7}, where h=0, ... , 7. Hence, the data words read out on the first even matrix clock cycle q'=0 can be directly outputted for instance to the fully parallel one dimensional transform block 110.

In a second odd matrix read cycle corresponding to read counter value q'=1, a second set of eight data words are read out on a clock cycle. In accordance with the transpose operation, the data words representing the matrix elements yo;01 to yo;71 should have to be outputted by the transpose memory (TRAM) 105.

The data words representing the matrix elements yo;01 to yo;71 are stored in the storage cells (k-h): 1-0, 1-1, 1-2, 1-3, 1-4, 1-5, 1-6, and 1-7, where h is the DPRAM block identification number h and k is the cell identification number of the storage cells in the respective DPRAM block h. Again, each of the data words representing the matrix elements yo;01 to yo;71 is stored in another DPRAM block h such that each outputs one data word in the first odd matrix read cycle. However, the data words to be read out are stored in cells having the same address, namely the data word representing the matrix elements yo;71 is stored in cell k=1 of the DRAM block 0, the data word representing the matrix elements yo;01 is stored in cell k=1 of the DRAM block 1, data word representing the matrix elements yo;11 is stored in cell k=1 of the DRAM block 2, . . . and the data word representing the matrix elements yo;61 is stored in cell k=1 of the DRAM block 7. Hence, the read addresses generated at the DPRAM blocks 0 to 7 is equal to the read counter value q'.

As aforementioned, the 8 data words read out from the DPRAM blocks form an 8-word data vector. According to first odd matrix read cycle, the word data vector has been formed starting with its first vector element read out from the DPRAM block h=0 and ending with its last vector element from the DPRAM block h=7. When now applying this scheme to form the output word data vector, the word data vector outputted by the DPRAM blocks 0 to 7 in this second odd matrix read cycle indicated by the read counter value q'=1 includes eight data words in the following sequence of data words representing the matrix elements vo; (q'=1)=(yo;71, yo;01, yo;11, . . . , yo;61). Hence, the corresponding vector element order ordo;jh(q') is ordo;jh(q'=1)={7, 0, 1, 2, 3, 4, 5, 6}.

Those skilled in the art will appreciate that the DPRAM block output vector vo; (q'=1) does not show the desired sequence order. The "misaligned" DPRAM block output vector is fed into the word reorderer 310, which rearranges the data words of the vector into the required vector element order. The operation of the word reorderer 310 has been described above in detail. When comparing the vector element order ordo;jh(q') as defined above and the vector element order orde;jh(q') as defined with respect to the even matrix read stage (cf. FIGS. 9a, 9b and description referring thereto) is becomes evident that the vector element order orde;jh(q') and the vector element order ordo;jh(q') correspond to each other. Hence, the word data vector outputted by the DPRAM blocks can be reordered by the word reorderer 310 such that the desired vector element order at the output of the word reorderer 310 is obtained.

In a third odd matrix read cycle associated with the read counter value q'=2, a third set of eight data words are read out on a clock cycle. In accordance with the transpose operation, the data words representing the matrix elements yo;02 to yo;72 should have to be outputted by the transpose memory (TRAM) 105.

The data words representing the matrix elements yo;02 to yo;72 are stored in the storage cells (k-h): 2-0, 2-1, 2-2, 2-3, 2-4, 2-5, 2-6, and 2-7, where h is the DPRAM block identification number h and k is the cell identification number of the storage cells in the respective DPRAM block h. Again, each of the data words representing the matrix elements yo;02 to yo;72 is stored in another DPRAM block h such that each outputs one data word in the third odd matrix read cycle. The data words to be read out are stored in cells having the same address, namely the data word are stored in the cells k=2 of the DPRAM blocks h=0 to 8. The read address is equal to the read counter value q'=2 signaled by the common counter logic.

The word data vector outputted in this third odd matrix read cycle associated with the read counter value q'=2 by the DPRAM blocks 0 to 7 includes eight data words in the following sequence of data words representing the matrix elements vo; (q'=2)=(yo;62, yo;72, yo;02, yo;12, . . . , yo;52) and the corresponding vector element order ordo;jh(q') is ordo;jh(q')={6, 7, 0, 1, 2, 3, 4, 5}.

In a fourth odd matrix read cycle (read counter value q'=3), a fourth set of eight data words are read out on a clock cycle. In accordance with the transpose operation, the data words representing the matrix elements yo;03 to yo;73 should have to be outputted by the transpose memory (TRAM) 105.

The data words representing the matrix elements yo;03 to yo;73 are stored in the storage cells (k-h): 3-0, 3-1, 3-2, 3-3, 3-4, 3-5, 3-6, and 3-7, where h is the DPRAM block identification number h and k is the cell identification number of the storage cells in the respective DPRAM block h. Again, each of the data words representing the matrix elements yo;03 to yo;73 is stored in another DPRAM block h such that each outputs one data word in the fourth odd matrix read cycle and the data words to be read out are stored in cells having the same address. The read address is equal to the read counter value q' signaled by the common counter logic.

The word data vector outputted in this fourth odd matrix read cycle (read counter logic q'=3) by the DPRAM blocks 0 to 7 includes eight data words in the following sequence of data words representing the matrix elements vo; (q'=3)=(yo; 53, yo;63, yo;73, yo;03, yo;13, . . . , yo;53) and the corresponding vector element order ordo;jh(q') is ordo;jh(q')={5, 6, 7, 0, 1, 2, 3, 4}.

The odd matrix read stages continues with the fifth read cycle (read counter value q'=4), sixth read cycle (read counter value q'=5) and seventh read cycle (read counter value q'=6) according to the above described writing scheme, respectively.

In a (final) eight odd matrix read cycle indicated by the read counter value q'=7 of the odd matrix reading stage, an eight set of eight data words are read out on a clock cycle. In accordance with the transpose operation, the data words representing the matrix elements yo;07 to yo;77 should have to be outputted by the transpose memory (TRAM) 105.

The data words representing the matrix elements yo;07 to yo;77 are stored in the storage cells (k-h): 7-0, 7-1, 7-2, 7-3, 7-4, 7-5, 7-6, and 7-7, where h is the DPRAM block identification number h and k is the cell identification number of the storage cells in the respective DPRAM block h. Again, each of the data words representing the matrix elements yo;07 to yo;77 is stored in another DPRAM block h such that each outputs one data word in the eight odd matrix read cycle and the data words to be read out are stored in cells having the same address. The read address is equal to the read counter value q'=7 signaled by the common counter logic.

The word data vector outputted in this eight odd matrix read cycle by the DPRAM blocks 0 to 7 includes eight data words in the following sequence of data words representing the matrix elements vo; (q'=7)=(yo;17, . . . , yo;77, yo;07) and the corresponding vector element order ordo;jh(q') is ordo;jh(q')={1, 2, 3, 4, 5, 6, 7, 0}.

According to a more general exemplary embodiment of the present invention, N data words are read out from the N DPRAM blocks 0 to N−1.

In a first odd matrix read cycle associated with the read counter value q'=0, the data words representing the matrix elements yo;00 to $y_0^{o;N-1}$ are stored in the storage cells (k-h): 0-0, . . . , 0-(N−1), where h is the DPRAM block identification number h and k is the cell identification number of the storage cells in the respective DPRAM block h. Each of the data words representing the matrix elements yo;00 to $y_0^{o;N-1}$ is stored in another DPRAM block h such that each outputs one data word in the first even matrix read cycle. The read address is equal to the read counter value q'=0.

The N data words read out from the DPRAM components form an N-word data vector, which includes the data words representing the matrix elements yo;00 to $y_0^{o;N-1}$ with increasing row index. The first vector element vo;0(q'=0) is provided by DPRAM block h=0, the second vector element vo;1(q'=0) is provided by DPRAM block h=1, . . . , the N−1 vector element vo;N−1 (q'=0) is provided by DPRAM block h=N−1. This means, the vector vo; (q) is vo; (q=0)=(yo;00, yo;10, . . . , $y_0^{o;N-1}$). With reference to the following description, it will be understood that a sequence order of the vector elements vo;h in the DPRAM block output vector vo; (q'=0) will have to be considered. Accordingly, a DPRAM block output vector element order ordo;jh(q') should be defined, which includes the individual row indexes of the vector elements with reference to the DPRAM block identifier h, where the DPRAM block output vector is formed on the basis of data words starting with the data word read out from DPRAM block h=0 and ending with the data word read out from DPRAM block h=N−1. Herein, the vector element order ordo;jh(q'=0)={0, 1, . . . , N−1}, where h=0, . . . , N−1.

In an odd matrix read cycle associated with the read counter value q', the data words representing the matrix elements yo;0q' to $y_{q'}^{o;N-1}$ are stored in the storage cells (k-h): q'-0, q'-1, . . . , q'-(N−1), where h is the DPRAM block identification number h and k is the cell identification number of the storage cells in the respective DPRAM block h. Each of the data words representing the matrix elements yo;0q' to $y_{q'}^{o;N-1}$ is stored in another DPRAM block h such that each outputs one data word in the odd matrix read cycle associated with the read counter value q'. The read address is equal to the read counter value q'.

In a more general exemplary embodiment, DPRAM block output vector vo; (q') results to vo; (q')=($y_{q'}^{o;N-q'(mod\ N)}$, $y_{q'}^{o;N-q'+1(mod\ N)}$, . . . , $y_{q'}^{o;N-q'+(N-1)(mod\ N)}$) and the corresponding vector element order ordo;jh (q') results to ordo;jh (q')={N−q'(mod N), N−q'+1(mod N), . . . , N−q'+(N−1)(mod N)}.

According to another exemplary embodiment of the present invention, the read address can be also defined as a function of the common read cycle number q':

read address(q')=q'.

The read addresses are summarized in FIG. 13.

[Reordering Operation]

As aforementioned, the DPRAM block output vectors vo; (q') (read counter value q'=0, . . . , N−1) have not the required element sequence. In FIG. 9a, the sequence order of the vector elements on input side of the word reorderer 310 is illustrated. As described above, the DPRAM block output vector vo; (q'=0) (which is the input vector to the word reorderer) has the vector element order ordo;jh(q'=0)={0, 1, 2, 3, 4, 5, 6, 7}, which corresponds to the desired element sequence. Hence, reordering is not necessary and the transpose memory (TRAM) word data output vector Vout; (q'=0) of the transpose memory (TRAM) 105 corresponds to the DPRAM block output vectors vo; (q'=0). The DPRAM block output vectors vo; (q'), where q'>0, do not show the desired vector element order. For instance, vector element order ordo; jh(q'=1)={7, 0, 1, 2, 3, 4, 5, 6}, vector element order ordo;jh (q'=2)={6, 7, 0, 1, 2, 3, 4, 5}, . . . , vector element order ordo;jh(q'=6)={2, 3, 4, 5, 6, 7, 0, 1} and vector element order ordo;jh(q'=7)={1, 2, 3, 4, 5, 6, 7, 0}. The vector element order sequence ordo;jh(q') again results from the initial vector element order sequence ordo;jh(q'=0)={0, 1, 2, 3, 4, 5, 6, 7} by cyclically shifting right by q' sequence elements.

The reordering scheme required to reorder the DPRAM block output vectors vo; (q'), q'=0, . . . , N−1, into the transpose memory (TRAM) output vector Vout; (q') is illustratively depicted in the table shown in FIG. 9b. The reordering may be implemented on the basis of element assignment scheme as a function of the read counter value q' in accordance with which element assignment scheme a vector element i of the word reorderer input vector (corresponding to the DPRAM block output vectors vo; (q')) is assigned to a vector element j of the word reorderer output vector (corresponding to transpose memory (TRAM) output vector Vout; (q'). Alternatively, the vector elements i of the word reorderer input vector can be cyclically shifted left by q' elements in order to obtain the desired word reorderer output vector.

[Even Matrix Transpose Operation]

The transpose operation of an "odd" input matrix including writing the input matrix into the transpose memory (TRAM) and outputting a transposed odd input matrix from the transpose memory (TRAM) has been described in detail above. Next, the transpose operation of an "even" input matrix Ye; follows in accordance with the matrix sequence ;mY. This operation has already been described above in detail. In the odd matrix read cycle indicated by the read counter value q'=0, the set of data words stored in the storage cells (k-h): 0-0, 0-1, 0-2, 0-3, 0-4, 0-5, 0-6, and 0-7 are read out. The data words already read out in the previous odd matrix read cycle are not required any more. Hence, the storage cells (k-h): 0-0, 0-1, 0-2, 0-3, 0-4, 0-5, 0-6, and 0-7 are available and new data words can be stored therein. The possibility to store new data words into transpose storage cells, which have been already read out, is used to write data words of the subsequent "even" input matrix therein. The writing of the data words of the subsequent "even" input matrix Ye; begins immediately after completion of the first odd matrix read cycle indicated by the read counter value q'=0.

Those skilled in the art will understand on the basis of the description above that the even input matrix write stage is interleaved with the odd input matrix read stage. The even input matrix write stage starts with an offset of at least one clock cycle with respect to the start of the odd input matrix read stage. Due to the use of dual port memory (DPRAM), the read and write operations can be performed on the same clock cycle but the write operation of the next matrix to be transposed is offset by at least one clock cycle in relation to the read operation of the matrix written into the transpose memory (TRAM).

FIGS. 14a and 14b illustratively depicts the storage state of the transpose memory (TRAM) at the odd matrix read cycle associated with the read counter value q'=1. The cells k=0 of the DPRAM blocks 0 to 7 have been read out and the data words stored therein are not required any more in the transpose operation. Hence, the cells k=0 of the DPRAM blocks 0 to 7 are available. This means that during the odd matrix read cycle corresponding to read counter value q'=1, the even matrix write cycle corresponding to write counter value q=0 is substantially simultaneously performed. During the same cycle, the odd matrix reading operation corresponding to read counter value q'=1, the even matrix writing operation corresponding to write counter value q=0 is performed. This applies likewise to the following odd matrix read cycles.

Those skilled in the art will also appreciate from the above description that the suggested transpose memory (TRAM) may perform transpose operations without any dead cycles or wait cycles. Hence, the throughput of the transpose memory (TRAM) operating according to an exemplary embodiment of the present invention is maximized. The transpose operation has a latency of 8 cycles. The transpose memory (TRAM) can be implemented on the basis of standard dual port memory (DPRAM), which can be implemented to FPGAs or ASICs without specific efforts. In particular, the transpose memory (TRAM) according to an exemplary embodiment of the present invention can be used in Discrete Cosine Transform and Inverse Discrete Cosine Transform operations, where low latency and high throughput matrix transposition is desired to obtain at least improved operation efficiency.

With reference back to the 8×8 input matrix example, the write addresses and word select offsets can be also determined as following:
  word select offset$[2:0]$=$(k[2:0]-q[2:0])$ mod 8;
  if the input matrix is an even input matrix, e.g. if $q[3]$=0:
    write address$[0:2]$=q,
  if the input matrix is an odd input matrix, e.g. if $q[3]$=1:
    write address$[2:0]$=$(k[2:0]-q[2:0])$ mod 8, where k is the cell identifier (ID)/cell address, and q is the common write counter value. It should be noted that the notation in brackets refers to binary bit coding. The kind of matrix, which is currently written, i.e. whether an even or an odd matrix is currently written into the transpose memory (TRAM) may be separately signaled to the write address and word select offset logic 220 or may be coded in the write counter value q signaled by the common counter logic for instance as an additional bit $q[3]$, which is interpreted as flag by the write address and word select offset logic 220.

The read addresses can be also determined as following:
  if the input matrix is an even input matrix, e.g. if $q'[3]$=0:
    read address$[2:0]$=$(k[0:3]-q'[2:0])$ mod 8,
  if the input matrix is an odd input matrix, e.g. if $q'[3]$=1:
    write address$[2:0]$=q', where $k[2:0]$ is the cell identifier (ID)/cell address, and q' is the common read counter value. The kind of matrix, which is currently read out, i.e. whether an even or an odd matrix is currently read out from the transpose memory (TRAM) may be separately signaled to the read address logic 240 or may be coded in the read counter value q' signaled by the common counter logic for instance as an additional bit $q'[3]$, which is interpreted as flag by the read address logic 240.

The modulo function as used throughout this application should be understood to comply with following definition:
  a mod m=(a+km) mod m, where k∈Z.
  Hence, r=a mod m≧0, for each m≧0.

The aforementioned algorithm can be generalized to be used for transposition of $2^n \times 2^n$ matrices, where n>2. The write addresses and word select offsets can be also determined as following:
  word select offset$[n-1:0]$=$(k[n-1:0]-q[n-1:0])$ mod $2^n$;
  if the input matrix is an even input matrix, e.g. if $q[n]$=0:
    write address$[n-1:0]$=q;
  if the input matrix is an odd input matrix, e.g. if $q[n]$=1:
    write address$[n-1:0]$=$(k[n-1:0]-q[n-1:0])$ mod $2^n$.

The read addresses can be also determined as following:
  if the input matrix is an even input matrix, e.g. if $q'[n]$=0:
    read address$[n-1:0]$=$(k[n-1:0]-q'[n-1:0])$ mod $2^n$;
  if the input matrix is an odd input matrix, e.g. if $q'[n]$=1:
    write address$[n-1:0]$=q'.

A concrete implementation of the reordering scheme is illustrated in FIG. 15.

Figure 16:
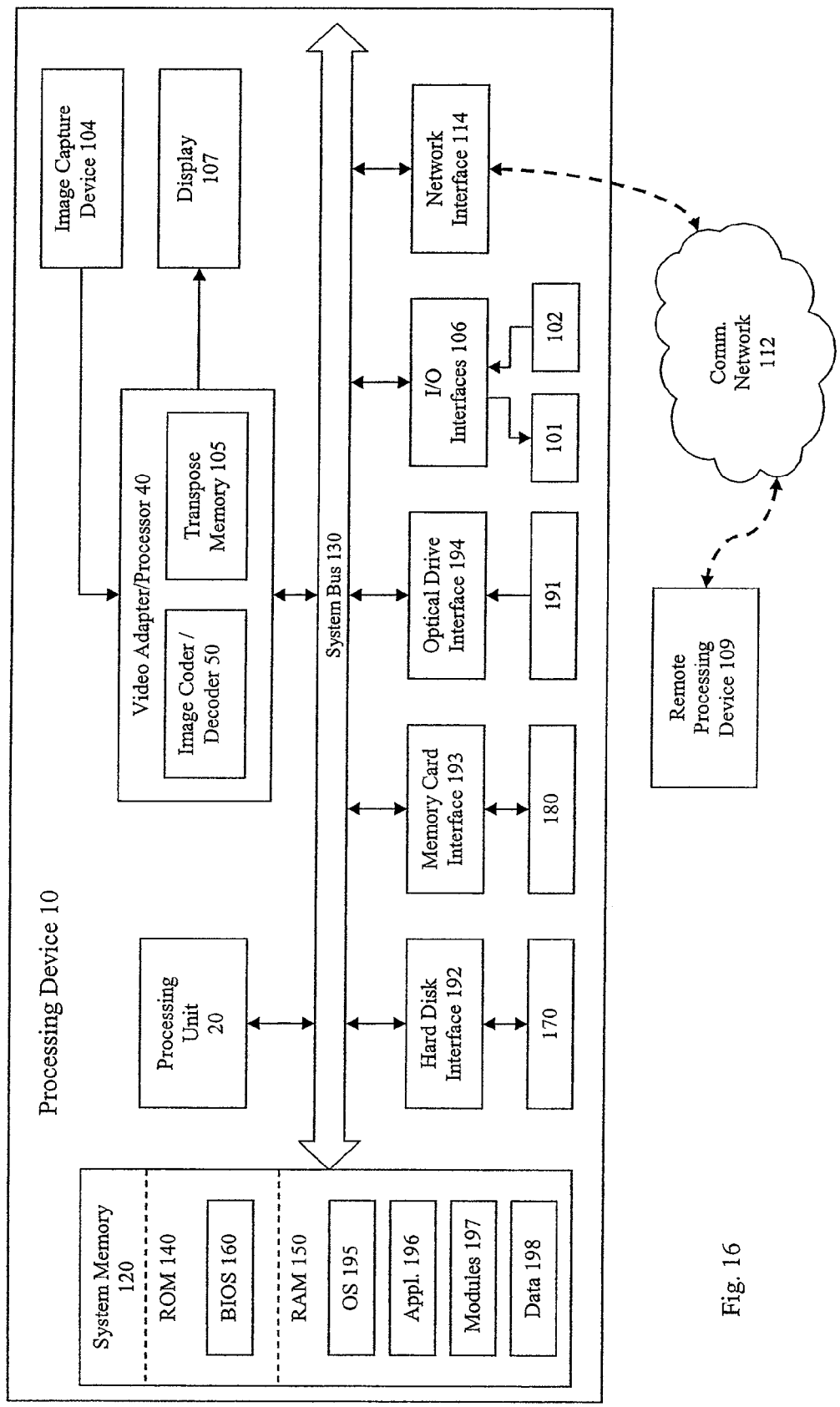
FIG. 16 depicts schematically a block diagram of a general processing device according to an exemplary embodiment of the present invention.

The invention may be implemented on the basis of hardware components including for instance circuitries and integrated circuits such that it may be helpful for a better understanding of the invention to briefly discuss the components and operation of a typical hardware environment on which various embodiments of the invention may be employed. Such an exemplary processing environment is illustrated in FIG. 16. The system includes for instance a general-purpose processing device 10 such as a computer including a personal digital assistant, a tablet, desktop or notebook personal computer, network server, a portable processing device including a smart phone, a cellular phone, a digital still image camera, a digital video camera, or the like.

The processing device 10 typically includes at least some form of computer readable media. Computer readable media can be any available media that can store data to be accessed by the processing device 10. By way of example, and not limitation, computer readable media may comprise storage media. Computer storage media includes volatile and non-volatile, removable and non-removable media implemented in any method or technology for storage of information such as computer readable instructions, data structures, program modules or other data. Computer storage media includes, but is not limited to, random access memory (RAM), read only memory (ROM), electrical erasable read only memory (EEPROM), flash memory or other memory technology, optical mass storage technology such as CD-ROOM, digital versatile disks (DVD) or other optical storage media, magnetic mass storage technology such as magnetic cassettes, magnetic tape, magnetic disk storage or other magnetic storage devices or any other medium which can be used to store the desired information and which can be accessed by the processing device 10.

Computer storage media is different and does not encompass communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media.

The processing device 10 typically includes a processing unit 20, a system memory 120, and a system bus 130 that couples various system components including the system memory to the processing unit 20. The system bus 130 may be any of several types of bus structures including a memory bus or memory controller, a peripheral bus, and a local bus using any of a variety of bus architectures. The system memory 120 includes read only memory (ROM) 140 and random access memory (RAM) 150. A basic input/output system 160 (BIOS) or any other basic operating system, containing the basic routines that help to transfer information between elements within the processing device 10, such as during start-up, is stored in the read only memory (ROM) 140 or any other non-volatile storage medium.

The processing device 10 may further include additional computer storage media devices, such as a hard disk drive for reading from and writing to a hard disk 170, a magnetic disk drive for reading from or writing to a removable magnetic disk, an optical disk drive for reading from or writing to a removable optical disk 180, such as a CD ROM, DVD-ROM, or other optical media and a memory card interface 193 for reading from or writing to a removable memory card 180. The hard disk drive, magnetic disk drive, and optical disk drive are connected to the system bus 130 by a hard disk drive interface 192, a magnetic disk drive interface, and an optical disk drive interface 194, respectively. The drives and their associated computer-readable media provide nonvolatile storage of computer readable instructions, data structures, program modules, and other data for the processing device 10. It will be appreciated by those skilled in the art that other types of computer readable media that may store data that is accessible by a computer, such as magnetic cassettes, flash memory cards 180 (including multimedia memory cards, secure data cards etc.), digital video disks, Bernoulli cartridges, random access memories (RAMs), read only memories (ROMs), non-volatile memory, and the like, may also be used in the example operating environment. Also, it should be appreciated that more portable embodiments of the processing device 10, such as a tablet personal computer, personal digital assistant or a portable device capable for wireless communication including in particular a cellular phone, may omit one or more of the computer storage media devices discussed above.

A number of program modules may be stored on the hard disk drive, magnetic disk, optical disk, ROM 140, or RAM 150, including an operating system 195, one or more application programs 196, other program modules 197, and program data 198. A user may enter commands and information into the processing device 10 through various input devices, such as a keyboard or a keypad 101, a pointing device 102 (for example, a mouse, touch pad, or pointing stick, a pen, touch screen etc.).

The processing device 10 may operate in a networked environment 112 using logical connections to one or more remote computers, such as one or more remote processing devices 109. The remote computer 109 may be a server, a router, a network computer, a peer device, or other common network node, and typically includes many or all of the elements described above relative to the processing device 10.

The logical connections depicted in FIG. 16 include wire-based networks such as local area network (LAN), a wide area network (WAN) and the like. The logical connections further include wireless networks such as wireless local area networks (WLAN), cellular networks and the like. Such networking environments are commonplace in home environments, cellular networks, offices, enterprise-wide networks, intranets, and the Internet, and thus will not be explained in detail here.

When used in a LAN networking environment, the processing device 10 is connected to the local network through a network interface or adapter 114. When used in a WAN networking environment, the processing device 10 may include a modem or other means for establishing a communications link over the wide area network, e.g., to the Internet. When used in a cellular networking environment, the processing device 10 typically included a cellular communication interface for establishing a communication link over the air to an access network and further e.g. to the Internet. It will be appreciated that the network connections shown are exemplary and other techniques for establishing a communications link between the computers may be used. The existence of any of various well-known protocols such as TCP/IP, Ethernet, FTP, HTTP, WAP, and the like is presumed, and the system may be operated in a client-server configuration to permit a user to retrieve web pages from a web-based server. Any of various conventional web browsers may be used to display and manipulate data on web pages.

A display 107 or other type of display device is also connected to the system bus 130 via a video processor 40, such as a video adapter 40. The processing device may also comprise an image capturing device 104 such as a still image digital camera or digital video camera (typically implemented on the basis of charge coupled devices (CCDs)). The image capturing device 104 may be coupled through the video adapter/ processor 40 to the system bus 130 of the processing device 10. In addition to the display 107, processing device may include other input/output devices (not shown), such as speakers and microphone.

As previously noted, the invention is directed to a transpose memory. In accordance with the aforementioned exemplary embodiment, the transpose memory is in particular applicable with application specific processors such an enhanced video processor implemented with the video adapter 40. However, it should be noted that the transpose memory is not limited to this merely exemplary embodiment. The transpose memory may be likewise implemented together with any general purpose processor such as processor 20 or application specific processor. The transpose memory 105 may be combined in a same integrated circuit together with a video/image encoder/decoder 50 and/or a video/image processor 40 or the transpose memory 105 may be provided as a separate circuitry component.

From the forgoing description, it will be apparent that modifications can be made to the system without departing from the teaching of the present invention. Accordingly, the scope of the invention is only to be limited as necessarily by the accompanying claims.

The invention claimed is:

1. A transpose memory circuit, comprising:
    a number of dual port memory blocks each having a plurality of storage cells each configured for storing at least one data word, wherein the dual port memory blocks represents a storage array for storing at least one input matrix and outputting at least one input matrix in transposed form;
    a data input configured to receive data words on each cycle;
    a data output configured to output data words on each cycle;
    a read address logic configured to generate read addresses to address one cell of each dual port memory block to be read out on each cycle; and
    a write address logic configured to generate write addresses to address one cell of each dual port memory block to be written on each cycle;
    wherein in each cycle, one storage cell of each dual port memory block is addressed by the read address logic, which data words stored in the addressed storage cells are read out from one dual port memory block and outputted through the data output;
    wherein in each cycle, one storage cell of each dual port memory block is addressed by the write address logic, which storage cells have been read out in a preceding cycle and into which storage cells data words received through the data input are written;
    wherein the transpose memory circuit is configured to receive the input matrix and to output the input matrix in transposed form in subsequent cycles without any dead cycles interposed between them.

2. The transpose memory circuit according to claim 1, comprising:
    a bus combiner configured to receive a plurality of data words at each cycle and to drive the received data words on a concatenated data bus; and
    select multiplexers coupling the concatenated data bus to each of the dual port memory blocks, wherein each of the select multiplexers is configured to select one data word out of the plurality of data words driven on the concatenated data bus.

3. The transpose memory circuit according to claim 1, comprising:

a word reorderer configured to receive a plurality of data words read out from the dual port memory blocks and to rearrange the sequence order of the received data words.

4. The transpose memory circuit according to claim 1,
wherein the read logic distinguishes succeeding input matrices out of a sequence of matrices into even input matrices and odd input matrices,
wherein each dual port memory block is identified by a first identifier, wherein each storage cell is identified by a second identifier.

5. The transpose memory circuit according to claim 4,
wherein the first identifier is a block identifier h, and
wherein the second identifier is a cell identifier k.

6. The transpose memory circuit according to claim 5,
wherein in case of an even input matrix is to be inputted,
the plurality of N data words received in the cycle associated with a write counter value q represents a row or column of the even input matrix,
wherein the write address logic assigns the data words to the dual port memory blocks h in accordance with a select sequence sele;h(q) defining which received data word is fed to which dual port memory block h, wherein the select sequence sele;h(q) is defined on an initial select sequence sele;h(q)={0, . . . , N−1} cyclically shifted right by q sequence elements,
wherein the write address logic addresses the storage cells k=q of the dual port memory blocks h for writing the data words.

7. The transpose memory circuit according to claim 5,
wherein in case of an odd input matrix is to be inputted,
the plurality of N data words received in the cycle associated with the write counter value q represent a row or column of the even input matrix,
wherein the write address logic assigns the data words to the dual port memory blocks h in accordance with a select sequence selo;h(q) defining which received data word is fed to which dual port memory block h, wherein the select sequence selo;h(q) is defined on an initial select sequence selo;h(q)={0, . . . , N−1} cyclically shifted right by q sequence elements;
wherein the write address logic addresses the storage cells k of the dual port memory blocks h for writing the data words in accordance with a write address sequence wro;h(q), which defines the storage cell to be addressed, wherein the write address sequence wro;h(q) is obtained from the initial sequence {0, 1, 2, . . . , N−1} cyclically shifted right by q sequence elements.

8. The transpose memory circuit according to claim 5,
wherein in case a transposed even input matrix is to be read
the read address logic addresses in the cycle associated with a read counter value q' the storage cells k of the dual port memory blocks h for reading the data words in accordance with a read address sequence rde;h(q'), which defines the storage cell to be addressed, wherein the write address sequence rde;h(q') is obtained from the initial sequence {0, 1, 2, . . . , N−1} cyclically shifted right by q' sequence elements.

9. The transpose memory circuit according to claim 5,
wherein in case a transposed even input matrix is to be read
the address logic addresses in the cycle associated with the read counter value q' the storage cells k=q' of the dual port memory blocks h for reading the data words.

10. The transpose memory circuit according to claim 1, wherein at least a part of the functionality of the transpose memory circuit is implemented on the basis of at least one out of a group comprising an integrated circuit, an application specific integrated circuit and a field-programmable gate array.

11. A method, comprising:
receiving a sequence of input matrices and outputting a sequence of the input matrices in transposed form by a transpose memory, which comprises a number of dual port memory blocks each having a plurality of storage cells each configured for storing at least one data word, wherein the dual port memories form a storage array for storing at least one input matrix and outputting at least one input matrix in transposed form, wherein each input matrix is received in a plurality of cycles and the transposed input matrix is outputted in subsequent cycles without any dead cycles interposed between them, wherein the transpose memory performs in each cycle:
outputting a plurality of data words of the transposed input matrix from the transpose memory, wherein the outputting includes addressing one storage cell of each dual port memory block, and reading out the data words stored in the addressed storage cells from one dual port memory block; and
receiving in each cycle a plurality of data words of the input matrix to be transposed, wherein the receiving includes addressing one storage cell of each dual port memory block, which storage cells have been read out in a preceding cycle and writing the received data words into the addressed storage cells.

12. The method according to claim 11, comprising:
receiving the data words of the input matrix to be transposed from a concatenated data bus, on which the data words are driven and selecting one data word out of the data words driven on the concatenated data bus for each dual port memory block and writing the selected data word into one of the storage cells of the respective dual port memory block.

13. The method according to claim 11, comprising:
receiving data words read out from the dual port memory blocks and rearranging the sequence order of the received data words.

14. The method according to claim 11,
wherein succeeding input matrices out of a sequence of matrices are distinguished into even input matrices and odd input matrices,
wherein each dual port memory block is identified by a first identifier, wherein each storage cell is identified by a second identifier.

15. The method according to claim 14,
wherein the first identifier is a block identifier h, and
wherein the second identifier is a cell identifier k.

16. The method according to claim 15,
wherein in case of an even input matrix is to be inputted the method comprising:
receiving the plurality of data words in the cycle associated with a write counter value q, where the plurality of data words represents a row or column of the even input matrix,
assigning each data word of the plurality of data words to one block h of the dual port memory blocks in accordance with a select sequence sele;h(q) defining which received data word is fed to which dual port memory block h, wherein the select sequence sele;h(q) is defined on an initial select sequence sele;h(q)={0, . . . , N−1} cyclically shifted right by q sequence elements, and
addressing the storage cells k=q of the dual port memory blocks h for writing the data words, where N is the number of data words to be written.

17. The method according to claim 15, wherein in case of an odd input matrix is to be inputted the method comprising:

receiving the plurality of data words in the cycle associated with the write counter value q, where the plurality of data words represents a row or column of the even input matrix, assigning each of the plurality of data words to the one block h of the dual port memory blocks in accordance with a select sequence selo;h(q) defining which received data word is fed to which dual port memory block h, wherein the select sequence selo;h(q) is defined on an initial select sequence selo;h(q)={0, . . . , N−1} cyclically shifted right by q sequence elements;

addressing the storage cells k of the dual port memory blocks h for writing the data words in accordance with a write address sequence wro;h(q), which defines the storage cell to be addressed, wherein the write address sequence wro;h(q) is obtained from the initial sequence {0, 1, 2, . . . , N−1} cyclically shifted right by q sequence elements, where N is the number of data words to be written.

18. The method according to claim 15, wherein in case a transposed even input matrix is to be read the method comprising:

addressing in the cycle associated with a read counter value q' the storage cells k of the dual port memory blocks h for reading the data words in accordance with a read address sequence rde;h(q'), which defines the storage cell to be addressed, wherein the write address sequence rde;h(q') is obtained from the initial sequence {0, 1, 2, . . . , N−1} cyclically shifted right by q' sequence elements, where N is the number of data words to be read out.

19. The method according to claim 15, wherein in case a transposed even input matrix is to be read the method comprising:

addressing in the cycle associated with the read counter value q' the storage cells k=q' of the dual port memory blocks h for reading the data words.

20. Computer program product comprising program code sections stored on a computer-readable storage medium, when executed by a data processing enabled component, for carrying out the method of:

receiving a sequence of input matrices and outputting a sequence of the input matrices in transposed form by a transpose memory, which comprises a number of dual port memory blocks each having a plurality of storage cells each configured for storing at least one data word, wherein the dual port memories form a storage array for storing at least one input matrix and outputting the at least one input matrix in transposed form, wherein each input matrix is received in a plurality of cycles and the transposed input matrix is outputted in subsequent cycles without any dead cycles interposed between them, wherein the transpose memory performs in each cycle:

outputting a plurality of data words of the transposed input matrix from the transpose memory, wherein the outputting includes addressing one storage cell of each dual port memory block, and reading out the data words stored in the addressed storage cells from one dual port memory block; and receiving in each cycle a plurality of data words of the input matrix to be transposed, wherein the receiving includes addressing one storage cell of each dual port memory block, which storage cells have been read out in a preceding cycle and writing the received data words into the addressed storage cells.

21. A processor, comprising a transpose memory circuit including:

a number of dual port memory blocks each having a plurality of storage cells each configured for storing at least one data word, wherein the dual port memory blocks represents a storage array for storing at least one input matrix and outputting the at least one input matrix in transposed form;

a data input configured to receive data words on each cycle;

a data output configured to output data words on each cycle;

a read address logic configured to generate read addresses to address one cell of each dual port memory block to be read out on each cycle; and a write address logic configured to generate write addresses to address one cell of each dual port memory block to be written on each cycle;

wherein in each cycle, one storage cell of each dual port memory block is addressed by the read address logic, which data words stored in the addressed storage cells are read out from one dual port memory block and outputted through the data output;

wherein in each cycle, one storage cell of each dual port memory block is addressed by the write address logic, which storage cells have been read out in a preceding cycle and into which storage cells data words received through the data input are written;

wherein the transpose memory circuit is configured to receive the input matrix and to output the input matrix in transposed form in subsequent cycles without any dead cycles interposed between them.

22. The processor according to claim 21, wherein the processor is a processor configured for image or video frame processing.

23. The processor according to claim 21, wherein the processor is part of a processing device comprising one out of a group including a server processing device, a desktop processing device, a portable processing device, a portable processing device capable for wireless communication, and a network processing device.

24. A processing device, comprising a transpose memory circuit including:

a number of dual port memory blocks each having a plurality of storage cells each configured for storing at least one data word, wherein the dual port memory blocks represents a storage array for storing at least one input matrix and outputting the at least one input matrix in transposed form;

a data input configured to receive data words on each cycle;

a data output configured to output data words on each cycle;

a read address logic configured to generate read addresses to address one cell of each dual port memory block to be read out on each cycle; and a write address logic configured to generate write addresses to address one cell of each dual port memory block to be written on each cycle;

wherein in each cycle, one storage cell of each dual port memory block is addressed by the read address logic, which data words stored in the addressed storage cells are read out from one dual port memory block and outputted through the data output;

wherein in each cycle, one storage cell of each dual port memory block is addressed by the write address logic, which storage cells have been read out in a preceding cycle and into which storage cells data words received through the data input are written;

wherein the transpose memory circuit is configured to receive the input matrix Y and to output the input matrix in transposed form in subsequent cycles without any dead cycles interposed between them.

25. The processing device according to claim 24, wherein the processing device is one out of a group including a server processing device, a desktop processing device, a portable processing device, a portable processing device capable for wireless communication, and a network processing device.

* * * * *

UNITED STATES PATENT AND TRADEMARK OFFICE
CERTIFICATE OF CORRECTION

| | | |
|---|---|---|
| PATENT NO. | : 7,669,014 B2 | Page 1 of 1 |
| APPLICATION NO. | : 11/781617 | |
| DATED | : February 23, 2010 | |
| INVENTOR(S) | : Jarno Mikael Tuominen | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 377 days.

Signed and Sealed this
Twenty-eighth Day of December, 2010

David J. Kappos
*Director of the United States Patent and Trademark Office*